US010141054B2

(12) United States Patent
Aoki et al.

(10) Patent No.: US 10,141,054 B2
(45) Date of Patent: Nov. 27, 2018

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Takeshi Aoki, Atsugi (JP); Munehiro Kozuma, Isehara (JP); Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/232,106

(22) Filed: Aug. 9, 2016

(65) Prior Publication Data

US 2017/0053699 A1 Feb. 23, 2017

(30) Foreign Application Priority Data

Aug. 21, 2015 (JP) ................. 2015-163432

(51) Int. Cl.
*H01L 27/12* (2006.01)
*G11C 14/00* (2006.01)
(Continued)

(52) U.S. Cl.
CPC .......... *G11C 14/0054* (2013.01); *G11C 11/24* (2013.01); *G11C 14/00* (2013.01);
(Continued)

(58) Field of Classification Search
CPC ............. H01L 29/786; H01L 29/78609; H01L 27/0688; H01L 27/1225; G11C 14/0054; G11C 11/24; G11C 14/00; H03K 3/356008; H03K 19/1776; H03K 19/17764

See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1349174 A2 * 10/2003 ............... G11C 7/12
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Charles Garber
*Assistant Examiner* — Abdulfattah Mustapha
(74) *Attorney, Agent, or Firm* — Robinson Intellectual Property Law Office; Eric J. Robinson

(57) ABSTRACT

A semiconductor device that has a long data retention time during stop of supply of power supply voltage by reducing leakage current due to miniaturization of a semiconductor element. In a structure where charge corresponding to data is held with the use of low off-state current of a transistor containing an oxide semiconductor in its channel formation region, a transistor for reading data and a transistor for storing charge are separately provided, thereby decreasing leakage current flowing through a gate insulating film.

18 Claims, 24 Drawing Sheets

(51) Int. Cl.
  *H03K 19/177* (2006.01)
  *H01L 27/06* (2006.01)
  *G11C 11/24* (2006.01)
  *H03K 3/356* (2006.01)
(52) U.S. Cl.
  CPC ...... *H01L 27/0688* (2013.01); *H01L 27/1225* (2013.01); *H03K 3/356008* (2013.01); *H03K 19/1776* (2013.01); *H03K 19/17764* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 9,064,574 B2 | 6/2015 | Aoki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0095338 A1* | 5/2004 | Miyazawa ............ G09G 3/325 345/204 |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0085635 A1* | 4/2011 | Koyama ............ G09G 3/3266 377/78 |
| 2011/0101339 A1 | 5/2011 | Yamazaki et al. |
| 2012/0293202 A1 | 11/2012 | Nishijima et al. |
| 2013/0181214 A1* | 7/2013 | Yamazaki ........... H01L 29/7869 257/43 |
| 2014/0126271 A1 | 5/2014 | Aoki et al. |
| 2014/0159771 A1* | 6/2014 | Ikeda ................. H03K 19/0016 326/41 |
| 2014/0374747 A1 | 12/2014 | Kurokawa |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-112827 | 6/2014 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature". Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:ModelIng of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AMOLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

Note that in this specification, a semiconductor device refers to a device including a semiconductor element or a circuit including a semiconductor element.

2. Description of the Related Art

Semiconductor devices such as a programmable logic device (PLD) and a central processing unit (CPU) have a variety of configurations depending on their applications. A PLD and a CPU include memory devices such as a register and a cache memory. As a register and a cache memory, a latch and static random access memory (SRAM) are usually used.

A semiconductor device has been developed in which a volatile memory device such as a latch or SRAM and a nonvolatile memory device are used in combination. For example, Patent Document 1 discloses a circuit configuration of a nonvolatile memory device in which a transistor containing an oxide semiconductor in its channel formation region (OS transistor) is connected to a gate of a transistor containing silicon in its channel formation region (Si transistor).

PATENT DOCUMENT

Patent Document 1: United States Patent Application Publication No. 2014/0126271

SUMMARY OF THE INVENTION

To achieve lower power consumption, faster operation, or higher integration of a semiconductor device, a semiconductor element such as a transistor used in the semiconductor device needs to be reduced in size. As the size of transistors is reduced, the thickness of a gate insulating film is also reduced according to the scaling law. With a thinner gate insulating film, tunneling current occurs and thus leakage current flowing between a gate and a semiconductor layer increases.

The semiconductor device in Patent Document 1 retains data by accumulating charge at a node between the OS transistor and the Si transistor. In such a semiconductor device, when leakage current of the Si transistor increases because of reduction in transistor size, accumulated charge is easily leaked and it becomes difficult to ensure a long data retention time.

In view of the foregoing technical background, an object of one embodiment of the present invention is to provide a semiconductor device with a long data retention time. Another object of one embodiment of the present invention is to provide a semiconductor device that can operate correctly at low power consumption. Another object of one embodiment of the present invention is to provide a novel semiconductor device.

Note that the objects of one embodiment of the present invention are not limited to the above. The objects described above do not preclude the existence of other objects. The other objects are objects that are not described above and will be described below. The other objects will be apparent from and can be derived from the description of the specification, the drawings, and the like by those skilled in the art. One embodiment of the present invention is to solve at least one of the above objects and the other objects.

One embodiment of the present invention is a semiconductor device including a first circuit and a second circuit. The first circuit has a function of retaining data while power supply voltage is supplied. The second circuit has a function of retaining data while power supply voltage is not supplied. The second circuit includes a first transistor, a second transistor, and a third transistor. A channel formation region of each of the first and second transistors contains an oxide semiconductor. A channel formation region of the third transistor contains silicon. A gate of the second transistor is electrically connected to one of a source and a drain of the first transistor. A gate of the third transistor is electrically connected to one of a source and a drain of the second transistor.

One embodiment of the present invention is a semiconductor device including a first circuit and a second circuit. The first circuit has a function of retaining data while power supply voltage is supplied. The second circuit has a function of retaining data while power supply voltage is not supplied. The second circuit includes a first transistor, a second transistor, and a third transistor. A channel formation region of each of the first and second transistors contains an oxide semiconductor. A gate of the first transistor is supplied with a first control signal for saving data from the first circuit to the second circuit. A channel formation region of the third transistor contains silicon. A gate of the second transistor is electrically connected to one of a source and a drain of the first transistor. A gate of the third transistor is electrically connected to one of a source and a drain of the second transistor. The other of the source and the drain of the second transistor is supplied with a second control signal for returning data from the second circuit to the first circuit.

In the semiconductor device of one embodiment of the present invention, a gate insulating film of the second transistor is preferably thicker than a gate insulating film of the third transistor.

In one embodiment of the present invention, the semiconductor device preferably includes a capacitor having a pair of electrodes one of which is electrically connected to the gate of the second transistor.

Note that other embodiments of the present invention will be shown in the following embodiments and the drawings.

One embodiment can provide a semiconductor device with a long data retention time. One embodiment of the present invention can provide a semiconductor device that can operate correctly at low power consumption. Furthermore, one embodiment of the present invention can provide a novel semiconductor device.

Note that the effects of one embodiment of the present invention are not limited to the above. The effects described above do not preclude the existence of other effects. The other effects are effects that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

DETAILED DESCRIPTION OF THE INVENTION

Figure 1:
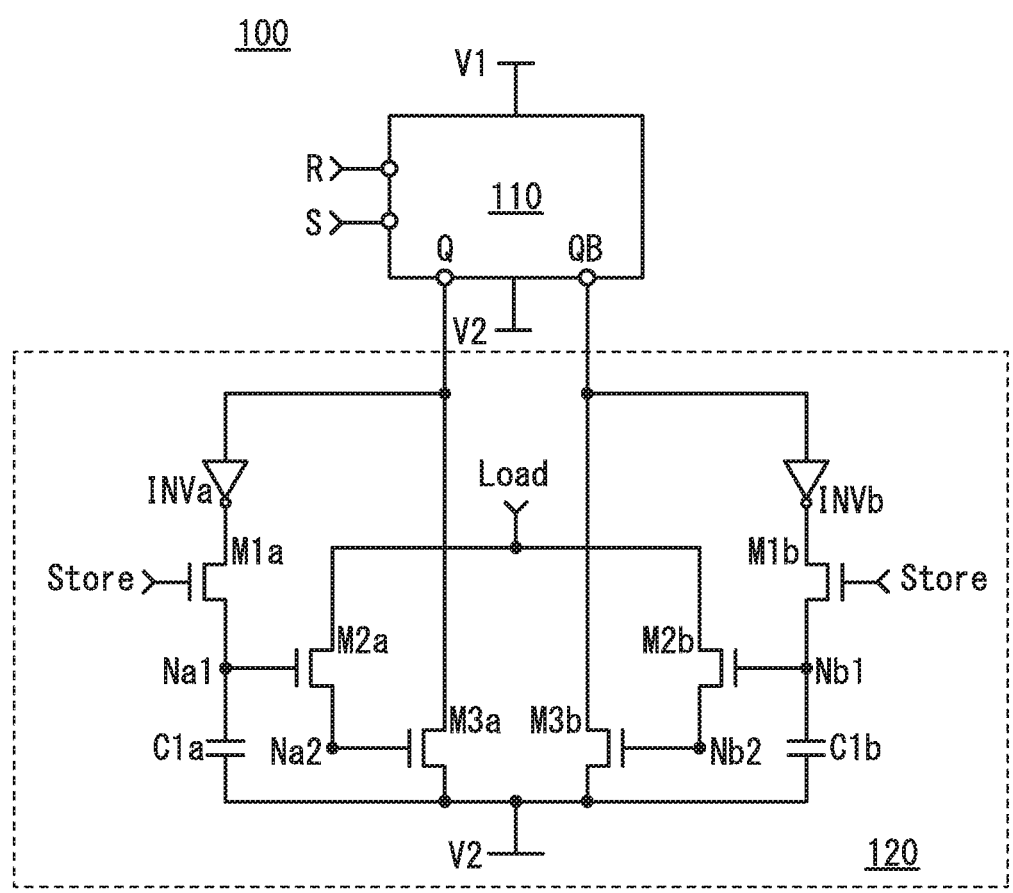
FIG. 1 is a circuit diagram illustrating one embodiment of the present invention.

Embodiments will be hereinafter described with reference to the accompanying drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components.

The same elements or elements having similar functions, elements formed using the same material, elements formed at the same time, or the like are sometimes denoted by the same reference numerals in the drawings, and the description thereof is not repeated in some cases.

Embodiment 1

This embodiment will explain an example of a semiconductor device that has a function of a nonvolatile memory device applicable to a register or the like.

<Configuration of Semiconductor Device>

FIG. 1 is a circuit diagram illustrating an example of a circuit configuration of a semiconductor device 100. The semiconductor device 100 includes a circuit 110 and a circuit 120.

The circuit 110 has a function of storing data while power supply voltage is supplied. The circuit 120 has a function of storing data even while power supply voltage is not supplied.

The circuit 110 is a latch, for example. In FIG. 1, the circuit 110 is an SR latch having an input terminal R, an input terminal S, an output terminal Q, and an output terminal QB.

The circuit 120 is composed of a combination of a transistor containing an oxide semiconductor in its channel formation region (OS transistor) and a transistor containing silicon in its channel formation region (Si transistor), and stores data by holding charge corresponding to data with the use of the transistor having low off-state current.

Note that in the following description, voltage $V_{DD}$ (also referred to as high-level voltage or simply as high level) corresponds to data "1." That is, storing charge corresponding to the voltage $V_{DD}$ means retaining data "1." On the other hand, voltage $V_{SS}$ (also referred to as low-level voltage or simply as low level) corresponds to data "0." That is, storing charge corresponding to the voltage $V_{SS}$ means retaining data "0."

Supply of power supply voltage can be controlled by switching voltage V1 and voltage V2. For example, power supply voltage is supplied when the voltage V1 is set to the voltage $V_{DD}$ and the voltage V2 is set to the voltage $V_{SS}$. Power supply voltage is not supplied when the voltage V1 and the voltage V2 are set to the same voltages (e.g., the voltage V1 and the voltage V2 are set to the voltage $V_{SS}$).

Next, the circuit 120 in one embodiment of the present invention will be described. The circuit 120 has a function of saving data of the output terminals Q and QB before the supply of power supply voltage to the circuit 110 is stopped, and retaining the data. The circuit 120 also has a function of returning the retained data to the output terminals Q and QB of the circuit 110 after the supply of power supply voltage is restarted.

The circuit 120 includes an inverter INVa, a transistor M1a, a transistor M2a, a transistor M3a, and a capacitor C1a to save and return data of the output terminal Q. Moreover, the circuit 120 includes an inverter INVb, a transistor M1b, a transistor M2b, a transistor M3b, and a capacitor C1b to save and return data of the output terminal QB.

Although all the transistors are n-channel transistors in the following description, a p-channel transistor may be used alternatively.

An input terminal of the inverter INVa is connected to the output terminal Q. An output terminal of the inverter INVa is connected to one of a source and a drain of the transistor M1a. The other of the source and the drain of the transistor M1a is connected to a node Na1. A gate of the transistor M1a is supplied with a control signal Store. The node Na1 is connected to the other of the source and the drain of the transistor M1a, a gate of the transistor M2a, and one electrode of the capacitor C1a. One of a source and a drain of the transistor M2a is supplied with a control signal Load. The other of the source and the drain of the transistor M2a is connected to a node Na2. The node Na2 is connected to the other of the source and the drain of the transistor M2a and a gate of the transistor M3a. One of a source and a drain of the transistor M3a is connected to the output terminal Q. The other of the source and the drain of the transistor M3a is supplied with the voltage V2, that is, the voltage $V_{SS}$. The other electrode of the capacitor C1a is supplied with the voltage V2, that is, the voltage $V_{SS}$.

An input terminal of the inverter INVb is connected to the output terminal QB. An output terminal of the inverter INVb is connected to one of a source and a drain of the transistor M1b. The other of the source and the drain of the transistor M1b is connected to a node Nb1. A gate of the transistor M1b is supplied with the control signal Store. The node Nb1 is connected to the other of the source and the drain of the transistor M1b, a gate of the transistor M2b, and one electrode of the capacitor C1b. One of a source and a drain of the transistor M2b is supplied with the control signal Load. The other of the source and the drain of the transistor M2b is connected to a node Nb2. The node Nb2 is connected to the other of the source and the drain of the transistor M2b and a gate of the transistor M3b. One of a source and a drain of the transistor M3b is connected to the output terminal QB. The other of the source and the drain of the transistor M3b is supplied with the voltage V2, that is, the voltage $V_{SS}$. The other electrode of the capacitor C1b is supplied with the voltage V2, that is, the voltage $V_{SS}$.

The inverters INVa and INVb are provided to output signals with inverted logic of data of the output terminals Q and QB, respectively. This structure is employed to invert data of the output terminals Q and QB in advance and save the inverted data, because there is an inverse relation between the saved data and the returned data in operations of saving and returning data between the circuit 110 and the circuit 120. The inverters INVa and INVb can be omitted if data is inverted, saved, and returned in a different manner. Furthermore, the inverters INVa and INVb can be provided as buffers for increasing the charge supply capability of the output terminals Q and QB.

The control signal Store is a signal for controlling the on/off state of the transistors M1a and M1b. Here, the transistors M1a and M1b are turned on with a high-level signal and are turned off with a low-level signal.

As the transistors M1a and M1b, a transistor with ultralow off-state current, such as an OS transistor, is used. Accordingly, voltages corresponding to data stored at the nodes Na1 and Nb1 can be held while the transistors M1a and M1b are off.

The capacitors C1a and C1b are provided to hold voltages corresponding to data stored at the nodes Na1 and Nb1. Note that the capacitors C1a and C1b can be omitted when the gate capacitance or the like of the transistors M2a and M2b is made large.

As the transistors M3a and M3b, a Si transistor, which has higher driving capability than an OS transistor, is used. To have higher driving capability, a Si transistor includes a thinner gate insulating film than an OS transistor. Accordingly, the amount of current flowing through the transistors M3a and M3b can be varied rapidly in accordance with the change in voltage of the nodes Na2 and Nb2.

As the transistors M2a and M2b, an OS transistor that includes a thicker gate insulating film than a Si transistor is used.

The control signal Load is a signal for varying the amount of current flowing through the transistors M3a and M3b in accordance with the voltages corresponding to data stored at the nodes Na1 and Nb1. For example, when the node Na1 is at high level and the control signal Load is at high level, the transistor M2a is turned on and the voltage of the node Na2 increases, so that the amount of current flowing through the transistor M3a increases. As another example, when the node Nb1 is at low level and the control signal Load is at high level, the transistor M2b is turned off and the voltage of the node Nb2 does not change; thus, the amount of current flowing through the transistor M3b does not change. By using the difference in voltage of the output terminals Q and QB caused by the difference in the amount of current flowing through the transistors M3a and M3b, data can be returned to the circuit 110.

In one embodiment of the present invention, gate insulating films of the transistors M2a and M2b connected to the nodes Na1 and Nb1, which correspond to the nodes for storing data, can be formed thick regardless of Si transistor scaling laws. Thus, the data retention time can be increased. Alternatively, in one embodiment of the present invention, data can be saved and returned between the circuit 110 and the circuit 120 in response to stop and restart of supply of power supply voltage. Consequently, lower power consumption due to stop of supply of power supply voltage can be achieved while data is retained properly.

<Operation of Semiconductor Device>

Figure 2:
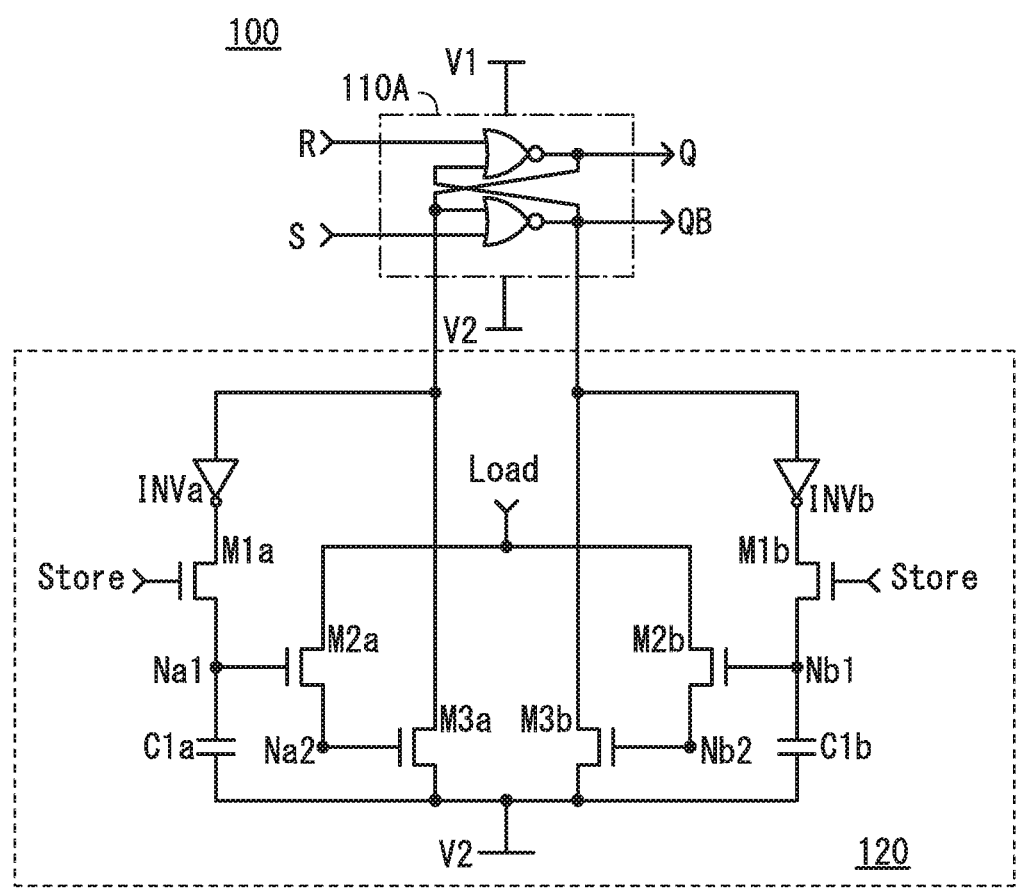
FIG. 2 is a circuit diagram illustrating one embodiment of the present invention.
Figure 3:
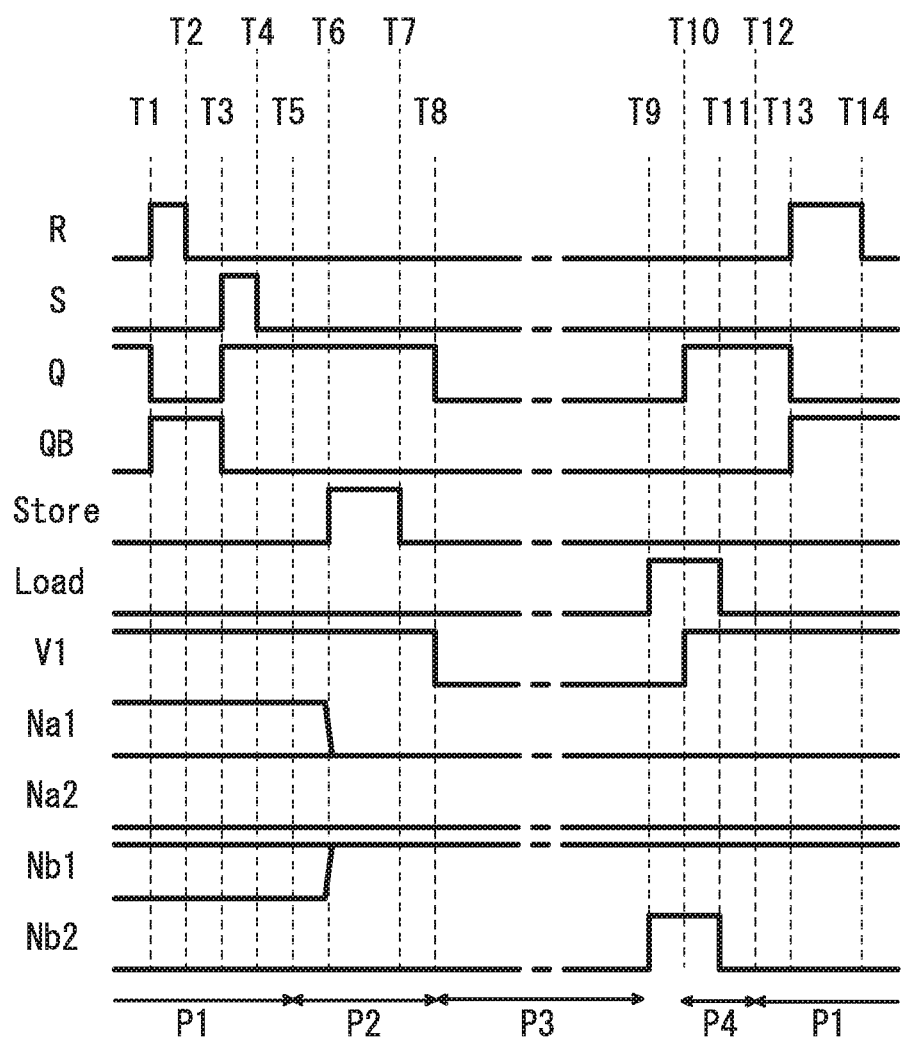
FIG. 3 is a timing chart showing one embodiment of the present invention.

Next, an example of the operation of the semiconductor device will be described with reference to FIG. 2. FIG. 2 is a circuit diagram of the semiconductor device 100 in which the circuit 110 in FIG. 1 is replaced with a circuit 110A that is an SR latch including two NOR circuits. FIG. 3 is a timing chart for explaining operations of saving and returning data, accompanied by stop and restart of supply of power supply voltage in the semiconductor device 100 of FIG. 2.

The timing chart of FIG. 3 shows high and low levels of signal waveforms at the input terminal R, the input terminal S, the output terminal Q, and the output terminal QB; waveforms of the control signal Store and the control signal Load; and waveforms representing changes in the voltage V1 and the voltages of the node Na1, the node Na2, the node Nb1, and the node Nb2. In the timing chart of FIG. 3, a time when the waveform changes is denoted by times T1 to T14. The timing chart of FIG. 3 also shows a period P1 for performing normal operation, a period P2 for performing data saving operation, a period P3 for stopping the supply of power supply voltage, and a period P4 for performing data returning operation. Although delay or the like is not considered for the waveforms illustrated in FIG. 3, the change in an output signal lags behind the change in an input signal in an actual circuit.

Figure 4:
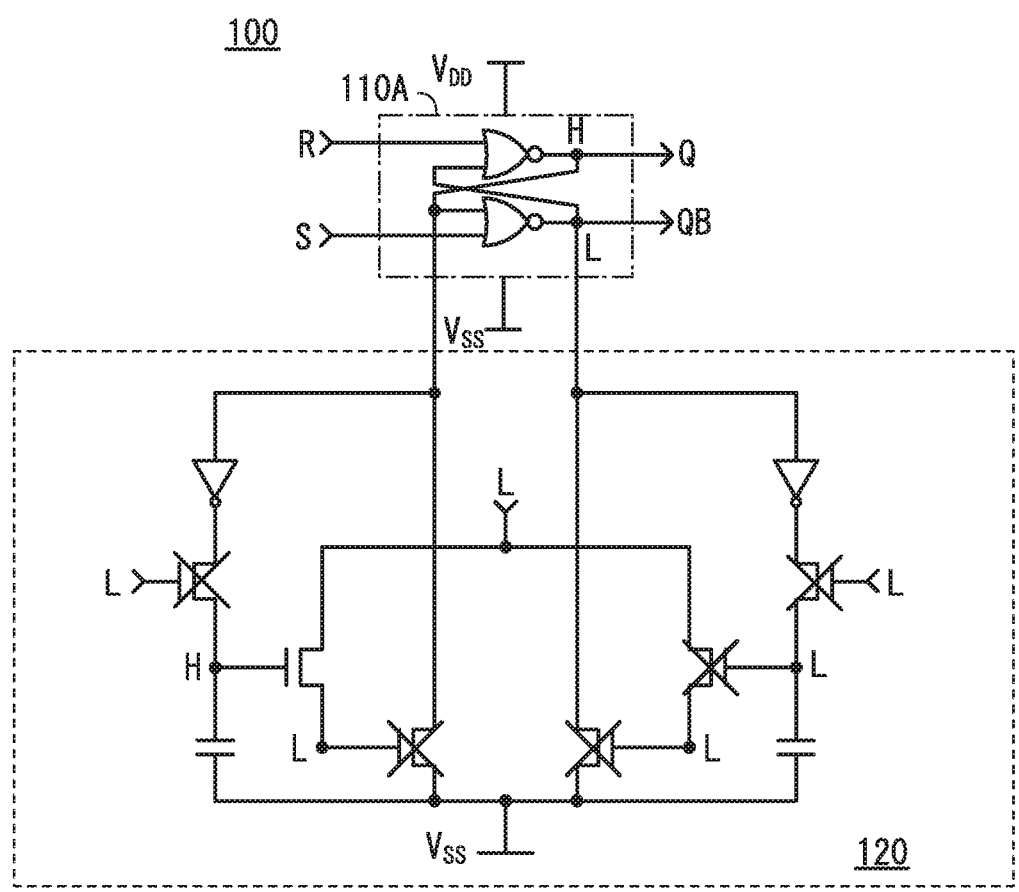
FIG. 4 is a circuit diagram illustrating one embodiment of the present invention.
Figure 5:
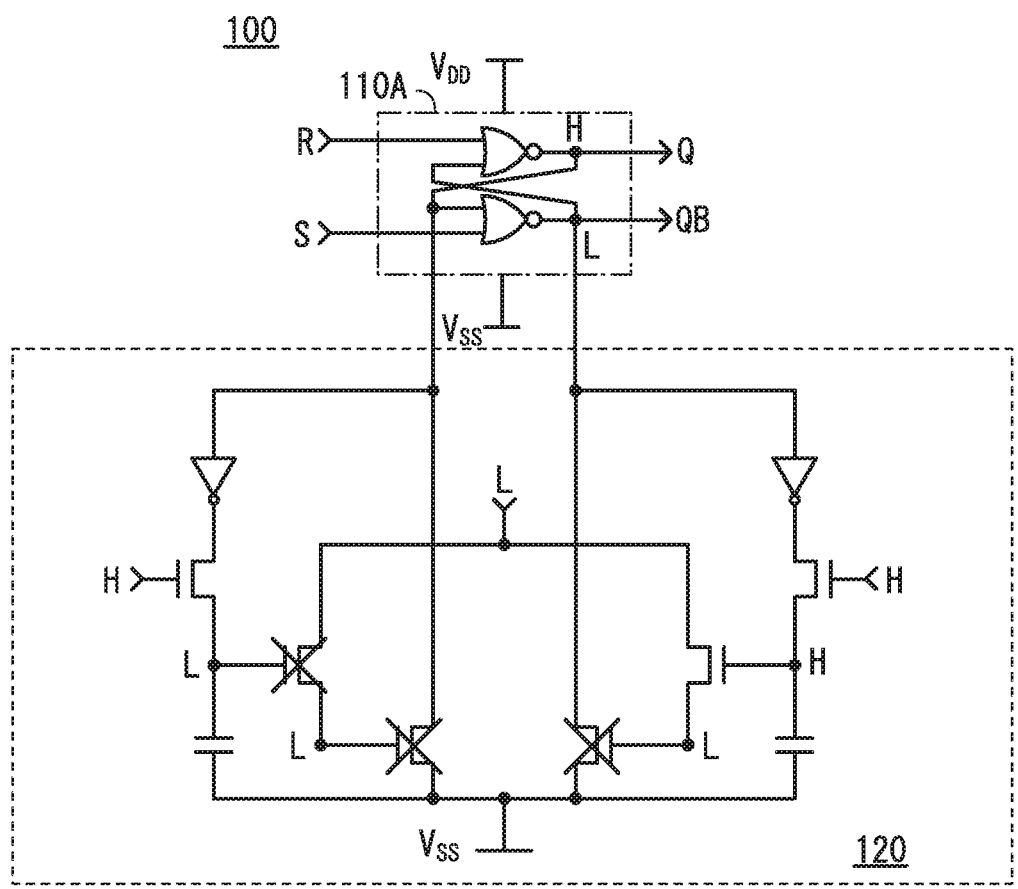
FIG. 5 is a circuit diagram illustrating one embodiment of the present invention.
Figure 6:
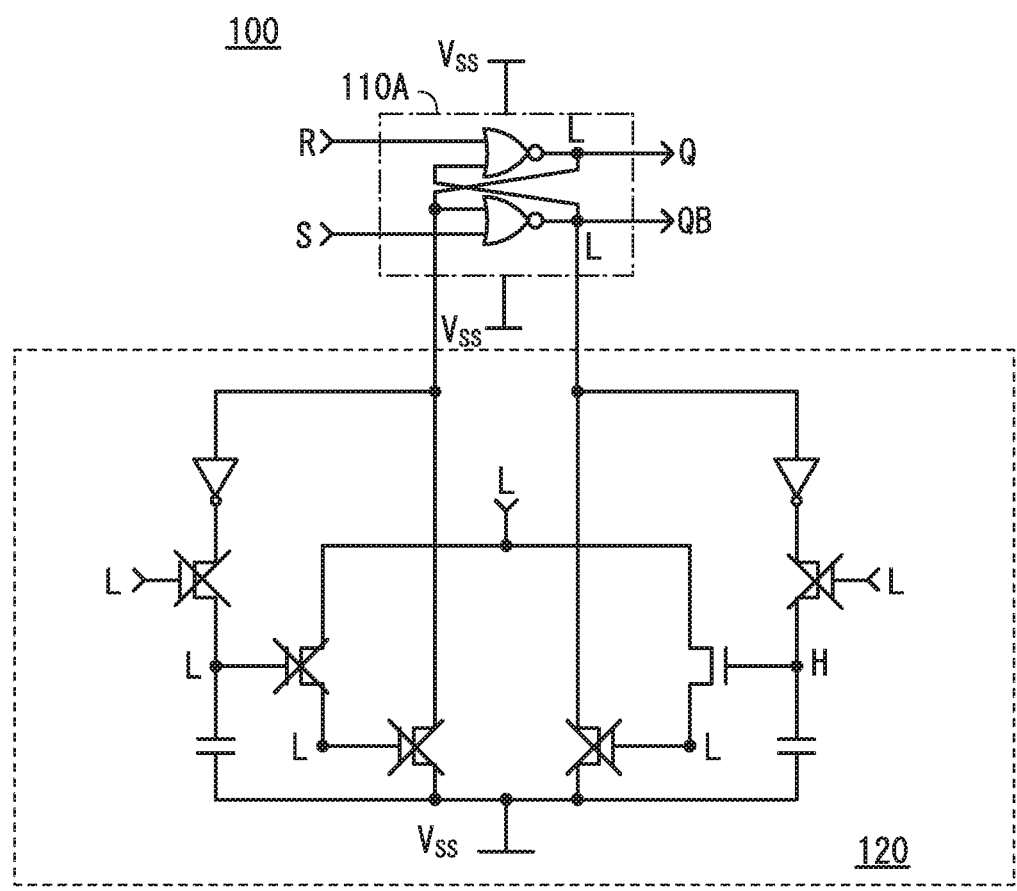
FIG. 6 is a circuit diagram illustrating one embodiment of the present invention.
Figure 7:
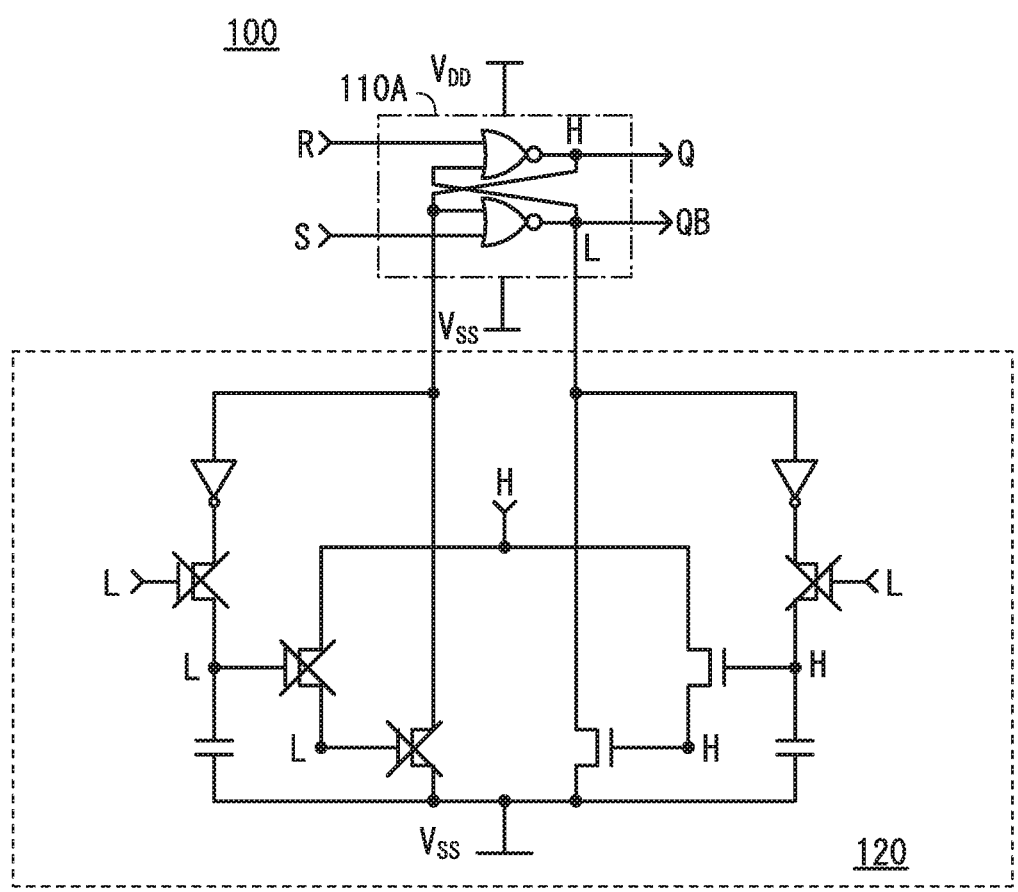
FIG. 7 is a circuit diagram illustrating one embodiment of the present invention.

FIGS. 4 to 7 illustrate the state of supply of power supply voltage to the circuit 110A, the state of each transistor in the circuit 120, the states of the control signals Store and Load, and the states of voltages corresponding to data of each output terminal and each node in the periods P1 to P4. FIG. 4 corresponds to T3 to T5 in the period P1; FIG. 5, T6 to T7 in the period P2; FIG. 6, T8 to T9 in the period P3; FIG. 7, T10 to T11 in the period P4.

At the time T1 in the period P1, the signal waveform at the input terminal R is changed from low level to high level, and data is reset. The signal waveform at the output terminal Q changes from high level to low level. The signal waveform at the output terminal QB changes from low level to high level. Then, at the time T2 in the period P1, the signal waveform at the input terminal R is changed from high level to low level, and the states of the output terminals Q and QB are maintained. Next, at the time T3 in the period P1, the signal waveform at the input terminal S is changed from low level to high level, and data is set. The signal waveform at the output terminal Q changes from low level to high level. The signal waveform at the output terminal QB changes from high level to low level. Subsequently, at the time T4 in the period P1, the signal waveform at the input terminal S is changed from high level to low level. Then, the states of the output terminals Q and QB are maintained also at the time T5 in the period P1. The above is the description of the period P1.

Next, at the time T6 in the period P2, the control signal Store is changed from low level to high level, and data of the circuit 110A is saved in the circuit 120. The voltages corresponding to the data of the output terminals Q and QB are inverted by the inverters and supplied to the nodes Na1 and Nb1. That is, low-level voltage is supplied to the node Na1 and high-level voltage is supplied to the node Nb1. Then, at the time T7 in the period P2, the control signal Store is changed from high level to low level, and the voltages corresponding to the data supplied to the nodes Na1 and Nb1 are stored in the circuit 120. The voltages held at the nodes Na1 and Nb1 are maintained by setting the control signal Store to low level and turning off the transistors M1a and M1b. In the structure of one embodiment of the present invention, as described above, the transistors M2a and M2b are OS transistors including a thicker gate insulating film than the transistors M3a and M3b, which are Si transistors. Thus, voltages corresponding to data can be easily stored even when the Si transistors are reduced in size and a gate insulating film therein becomes thinner. The above is the description of the period P2.

Next, at the time T8 in the period P3, the voltage V1 is changed from high level to low level (i.e., from the voltage $V_{DD}$ to the voltage $V_{SS}$), and the supply of power supply voltage to the circuit 110A is stopped. The output terminals Q and QB become low level. Meanwhile, the voltages of the nodes Na1 and Nb1 that are stored in the period P2 are maintained when the control signal Store is at low level. Accordingly, the circuit 120 can function as a nonvolatile memory device, which is capable of retaining data even when the supply of power supply voltage is stopped. The above is the description of the period P3.

Then, at the time T9, the control signal Load is changed from low level to high level, and the data is returned to the circuit 110A in accordance with the voltage held at the node Na1 in the circuit 120. The high-level voltage is held at the node Nb1, and the transistor M2b whose gate is connected to the node Nb1 is turned on. Thus, the voltage of the node Nb2 is changed from low level to high level in accordance with the change in waveform of the control signal Load. On the other hand, the low-level voltage is held at the node Na1, and the transistor M2a whose gate is connected to the node Na1 is turned off. Accordingly, the voltage of the node Na2 remains low level.

Next, at the time T10 in the period P4, the voltage V1 is changed from low level to high level (i.e., from the voltage $V_{SS}$ to the voltage $V_{DD}$), and the supply of power supply voltage to the circuit 110A is restarted. There occurs a difference in the amount of flowing current between the transistors M3a and M3b, which depends on the aforementioned difference in voltage between the node Na2 and the node Nb2 at the time T9. This difference in the current amount causes a difference in voltage rise between the output terminals Q and QB; thus, the output terminal Q becomes high level, and the output terminal QB becomes low level. That is, the original data at the time T5 can be returned to the circuit 110A. Subsequently, at the time T11 in the period P4, the control signal Load is changed from high level to low level, and the voltage of the node Nb2 changes from high level to low level accordingly. At the time T12 in the period P1, the states of the output terminals Q and QB are maintained. The above is the description of the period P4.

At the time T13 in the period P1, the signal waveform at the input terminal R is changed from low level to high level, and data is reset again. The signal waveform at the output terminal Q changes from high level to low level. The signal waveform at the output terminal QB changes from low level to high level. Then, at the time T14 in the period P1, the signal waveform at the input terminal R is changed from high level to low level, and the states of the output terminals Q and QB are maintained.

With the above operations based on the timing chart, the semiconductor device 100 in FIG. 2 can save and return data accompanied by stop and restart of supply of power supply voltage.

<Variation Examples of Semiconductor Device>

Next, variation examples of the aforementioned semiconductor device will be described.

As the circuit 110 described using FIG. 1, a latch or a flip-flop is used, for example. The circuit 110 can be a D latch, a T latch, a JK latch, an SR latch, or the like, which depends on the kind of data to be applied.

Figure 8A:
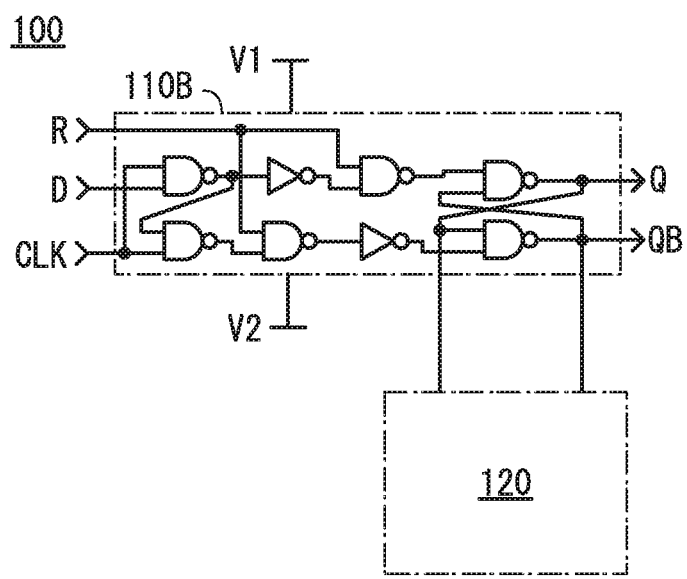
FIGS. 8A and 8B are circuit diagrams each illustrating one embodiment of the present invention.

For example, as in a circuit 110B illustrated in FIG. 8A, a D latch with a reset terminal be used. In this case, an input terminal R for reset, an input terminal D for data input, and a terminal CLK for supplying a clock signal are provided. The circuit 120 is provided to be connected to the output terminals Q and QB as illustrated in FIG. 8A.

As another variation of the circuit 110 described using FIG. 1, static random access memory (SRAM) can be used, for example.

Figure 8B:
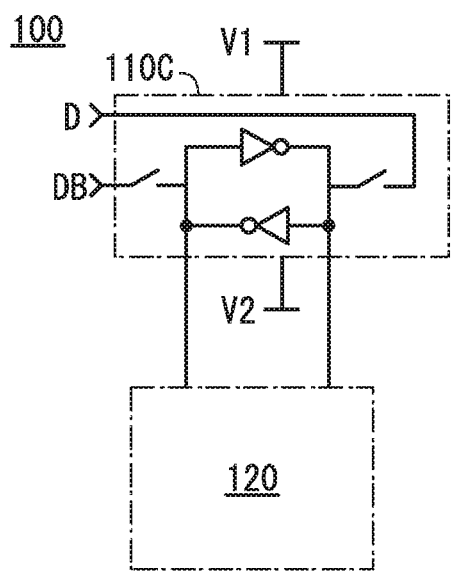

As in a circuit 110C illustrated in FIG. 8B, SRAM be used, for example. In this case, input terminals D and DB for data input are provided. The circuit 120 is provided to be connected to two terminals included in the inverter loop as illustrated in FIG. 8B.

Figure 9:
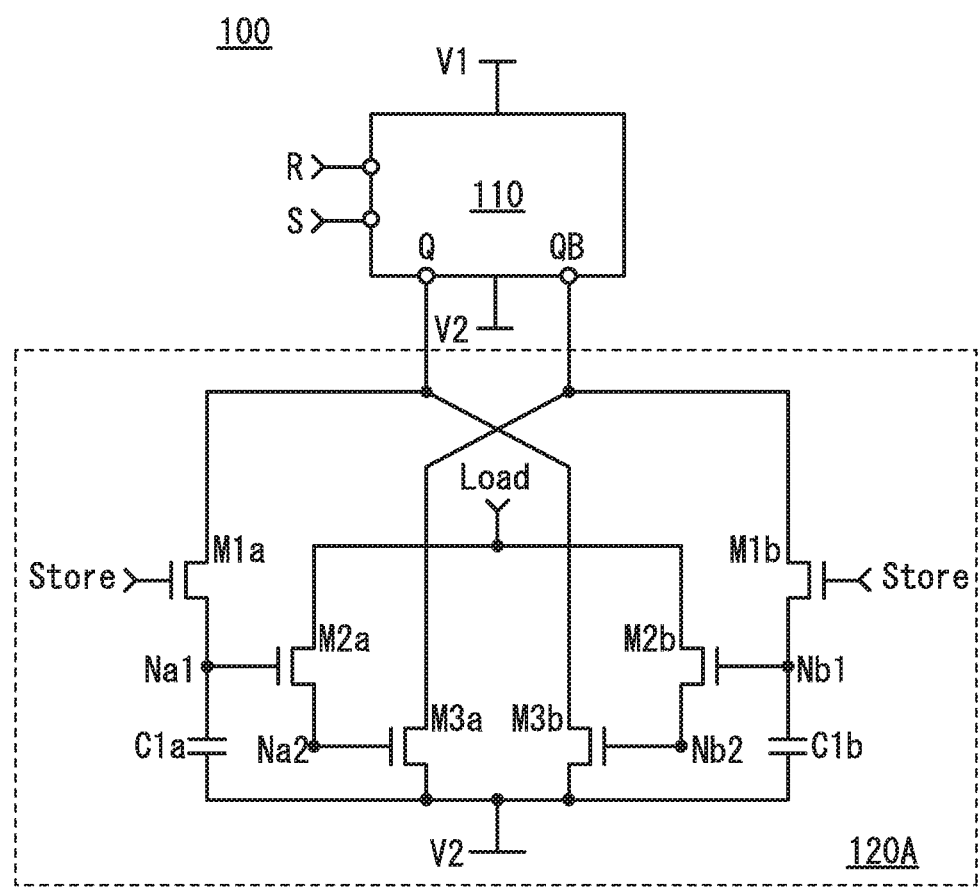
FIG. 9 is a circuit diagram illustrating one embodiment of the present invention.

In the circuit 120 described using FIG. 1, the inverters INVa and INVb can be omitted, for example. FIG. 9 is a circuit diagram of the semiconductor device 100 including a circuit 120A from which the inverters INVa and INVb are omitted. The circuit 120A differs from the circuit 120 described using FIG. 1 in that the output terminal Q is connected to the transistor M3b and the output terminal QB is connected to the transistor M3a. Accordingly, data can be saved and returned without the inverters INVa and INVb.

Figure 10A:
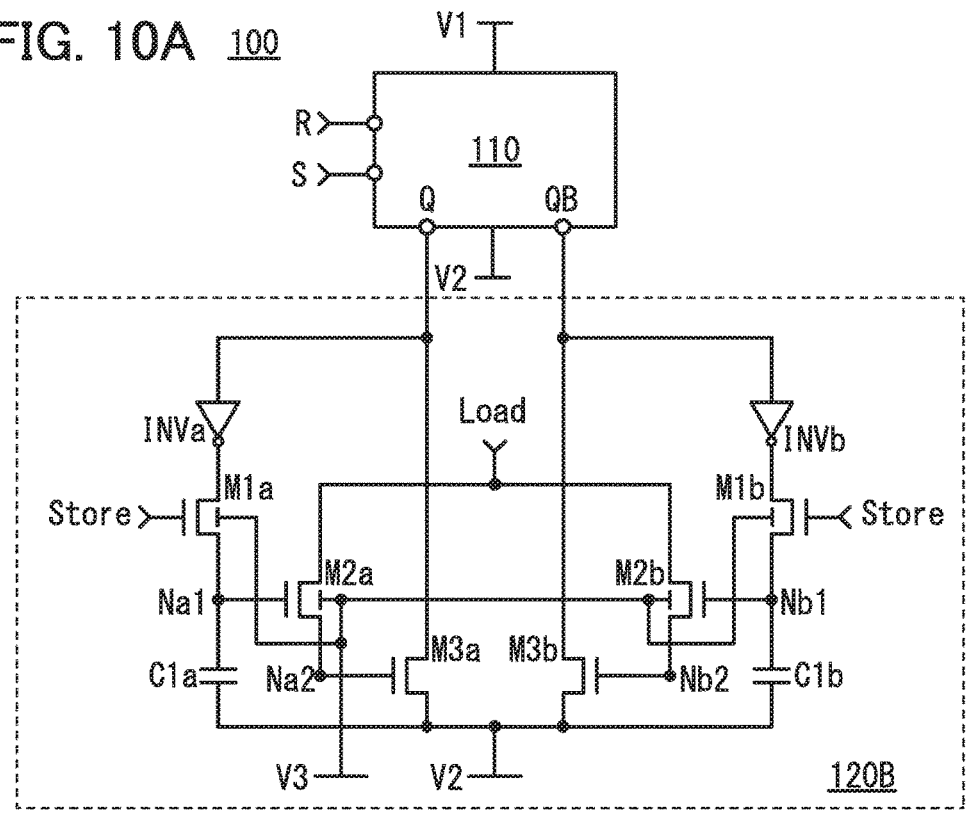
FIGS. 10A and 10B are circuit diagrams each illustrating one embodiment of the present invention.
Figure 10B:
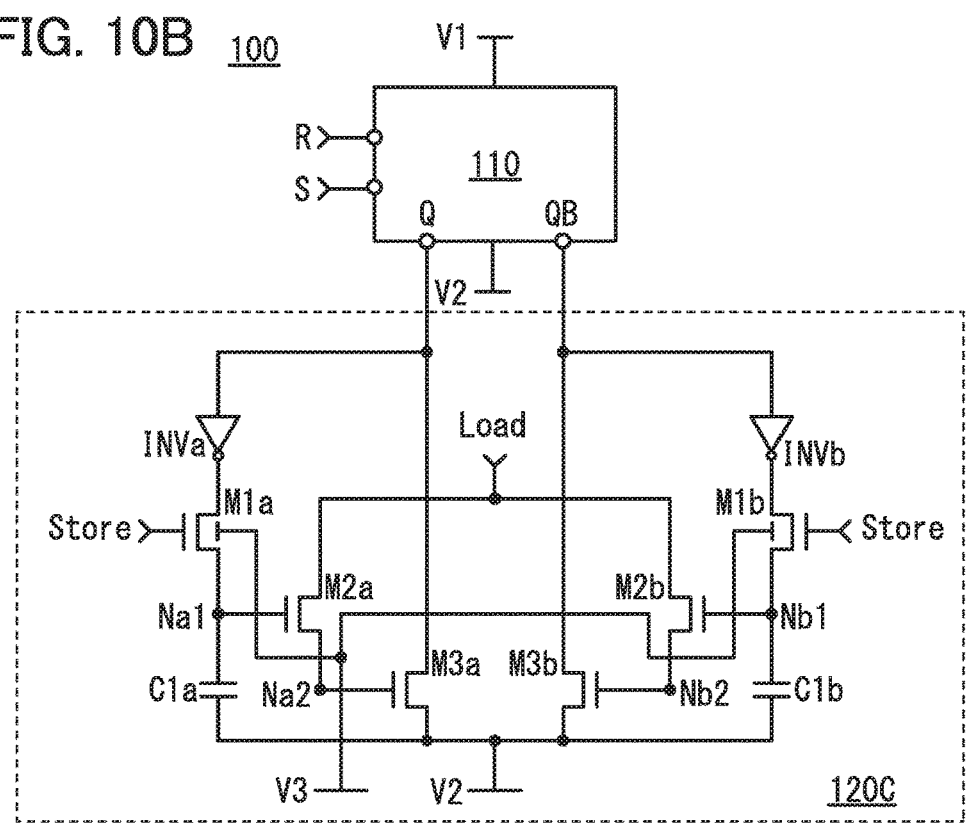

The transistors M1a, M1b, M2a, and M2b, which are OS transistors as described using FIG. 1, preferably have a backgate. Accordingly, the threshold voltage of these transistors can be easily controlled by changing voltage applied to their backgates. For example, the threshold voltage of each of the transistors M1a, M1b, M2a, and M2b is controlled by applying voltage V3 in common to their backgates as illustrated in FIG. 10A. Note that the voltage V3 is preferably lower than the voltage V2, in which case the threshold voltage of the transistors can be more easily shifted in the positive direction. As illustrated in FIG. 10B, only the transistors M1a and M1b, in which the other of the source and the drain is connected to the nodes Na1 and Nb1 for retaining data, may have a backgate. This structure allows the transistors M2a and M2b without a backgate to be turned on easily.

Embodiment 2

This embodiment will explain the OS transistor described in the foregoing embodiment.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8\times10^{11}/cm^3$, preferably lower than $1\times10^{11}/cm^3$, more preferably lower than $1\times10^{10}/cm^3$, and is higher than or equal to $1\times10^{-9}/cm^3$. In the oxide semiconductor, hydrogen, nitrogen, carbon, silicon, and a metal element other than main components of the oxide semiconductor are impurities. For example, hydrogen and nitrogen form donor levels to increase the carrier density.

A transistor using an intrinsic or substantially intrinsic oxide semiconductor has a low carrier density and thus is less likely to have negative threshold voltage. In addition, because of few carrier traps in such an oxide semiconductor, the transistor using the oxide semiconductor has small variation in electrical characteristics and high reliability. Furthermore, the transistor using the oxide semiconductor achieves an ultralow off-state current.

For example, an OS transistor with reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.

<Temperature Characteristics>

Figure 22A:
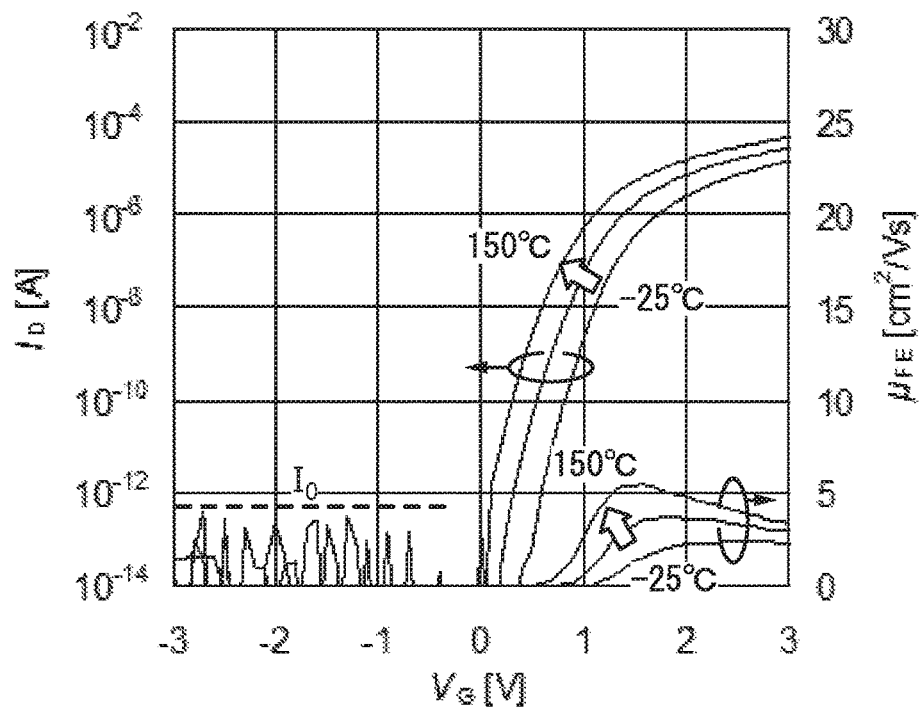
FIGS. 22A and 22B are graphs showing characteristics of transistors.
Figure 22B:
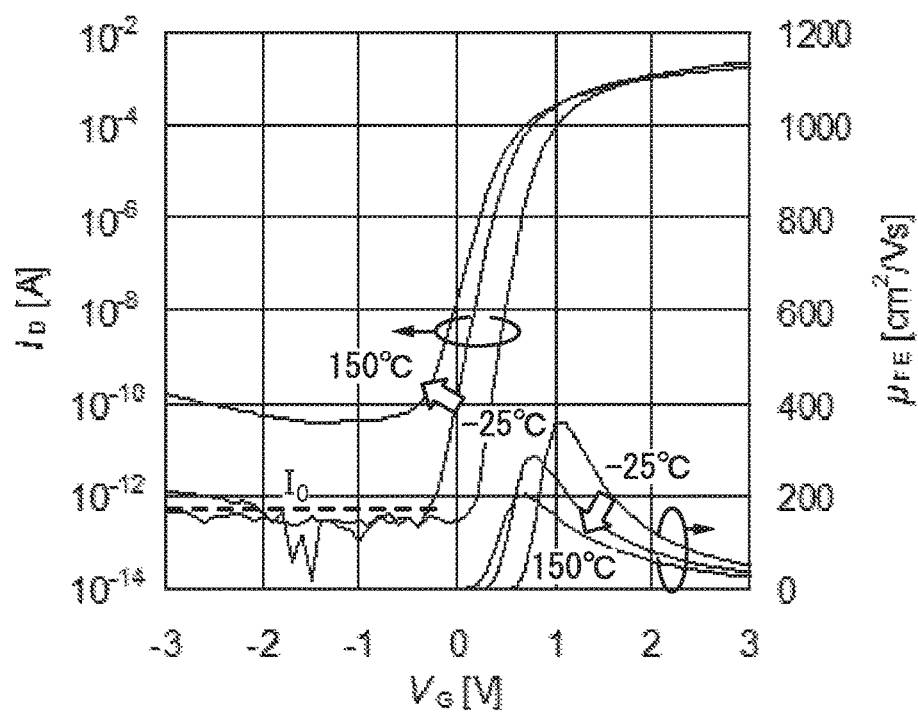

An OS transistor can be used at higher temperatures than a Si transistor. As specific examples, FIG. 22A shows temperature dependence of drain current-gate voltage ($I_D$-$V_G$) characteristics and electric field mobility-gate voltage ($\mu_{FE}$-$V_G$) characteristics of an OS transistor, and FIG. 22B shows temperature dependence of $I_D$-$V_G$ characteristics and $\mu_{FE}$-$V_G$ characteristics of a Si transistor. FIGS. 22A and 22B show measurement results of the electrical characteristics at −25° C., 50° C., and 150° C. Note that the drain voltage $V_D$ is 1 V.

FIG. 22A shows the electrical characteristics of an OS transistor that has a channel length L of 0.45 μm, a channel width W of 10 μm, and a thickness $T_{ox}$ of an oxide film serving as a gate insulating layer of 20 nm. FIG. 22B shows the electrical characteristics of a Si transistor that has L of 0.35 μm, W of 10 μm, and $T_{ox}$ of 20 nm.

An oxide semiconductor layer in the OS transistor is made of an In—Ga—Zn-based oxide. The Si transistor is formed using a silicon wafer.

FIGS. 22A and 22B show that the rising gate voltage of the OS transistor has low temperature dependence. The off-state current of the OS transistor is lower than the lower measurement limit ($I_0$) independently of temperature. In contrast, the off-state current of the Si transistor largely depends on the temperature. According to the measurement results of FIG. 22B, at 150° C., the off-state current of the Si transistor increases, and a sufficiently high current on/off ratio cannot be obtained.

According to the graphs in FIGS. 22A and 22B, an OS transistor used as a switch can operate even at 150° C. or higher. Thus, a semiconductor device can have excellent heat resistance.

<Breakdown Voltage>

Here, the breakdown voltage of an OS transistor will be described in comparison with the breakdown voltage of a Si transistor.

Figure 23:
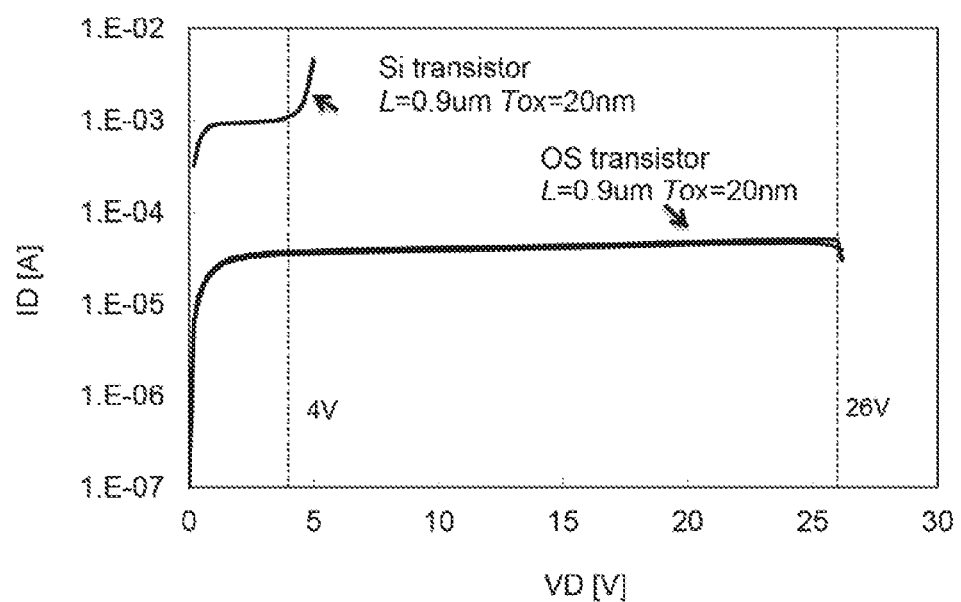
FIG. 23 is a graph showing characteristics of transistors.

FIG. 23 shows $I_D$-$V_D$ curves of a Si transistor and an OS transistor for explaining the drain breakdown voltage of the OS transistor. In FIG. 23, to compare the withstand voltages of the Si and OS transistors under the same conditions, both of the transistors have a channel length L of 0.9 μm, a channel width W of 10 μm, and a gate insulating film using silicon oxide with a thickness Tox of 20 nm. Note that the gate voltage is 2 V.

As shown in FIG. 23, avalanche breakdown occurs in the Si transistor at a drain voltage of approximately 4 V, whereas in the OS transistor, a constant current can flow until a drain voltage of approximately 26 V causes avalanche breakdown.

Figure 24A:
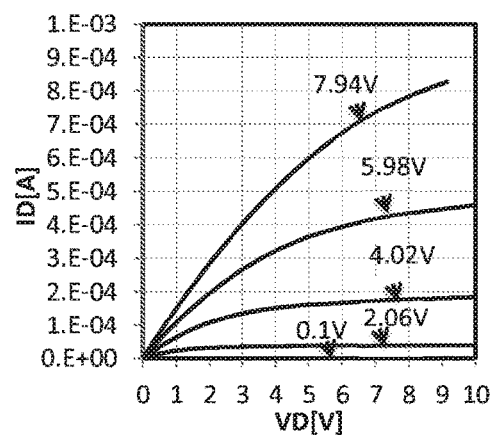
FIGS. 24A and 24B are graphs showing characteristics of transistors.
Figure 24B:
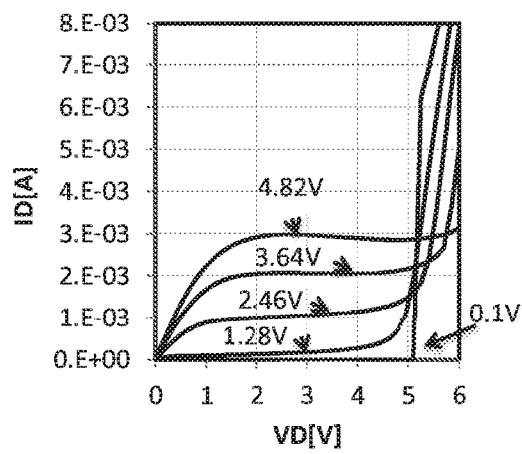

FIG. 24A shows $I_D$-$V_D$ curves of an OS transistor with varying gate voltage. FIG. 24B shows $I_D$-$V_D$ curves of a Si transistor with varying gate voltage. In FIGS. 24A and 24B, to compare breakdown voltages between the Si transistor and the OS transistor under the same conditions, both of the transistors have a channel length of 0.9 μm, a channel width of 10 μm, and a thickness of a gate insulating film using silicon oxide of 20 nm. The gate voltage changes from 0.1 V to 2.06 V, 4.02 V, 5.98 V, and 7.94 V in the OS transistor of FIG. 24A, and changes from 0.1 V to 1.28 V, 2.46 V, 3.64 V, and 4.82 V in the Si transistor of FIG. 24B.

As shown in FIGS. 24A and 24B, avalanche breakdown occurs in the Si transistor at a drain voltage of approximately 4 V to 5 V, whereas in the OS transistor, a constant current can flow until a drain voltage of approximately 9 V causes avalanche breakdown.

As shown in FIG. 23 and FIGS. 24A and 24B, an OS transistor has higher breakdown voltage than a Si transistor. Therefore, even when an OS transistor is provided in a portion to which high voltage is supplied, the OS transistor can operate stably without causing dielectric breakdown.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to an off-state current at given Vgs, at Vgs in a given range, or at Vgs at which a sufficiently low off-state current is obtained.

As an example, the assumption is made of an n-channel transistor where the threshold voltage Vth is 0.5 V and the drain current is $1 \times 10^{-9}$ A at Vgs of 0.5 V, $1 \times 10^{-13}$ A at Vgs of 0.1 V, $1 \times 10^{-19}$ A at Vgs of −0.5 V, and $1 \times 10^{-22}$ A at Vgs of −0.8 V. Since the drain current of the transistor is $1 \times 10^{-19}$ A or lower at Vgs of −0.5 V or at Vgs in the range of −0.8 V to −0.5 V, it can be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage between its drain and source (Vds) in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

An oxide semiconductor used for a semiconductor layer of an OS transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) is contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use In—Ga—Zn-based oxide with an atomic ratio of In:Ga:Zn=1:1:1, 3:1:2, 4:2:3, or 2:1:3 or close thereto.

<Impurities in Oxide Semiconductor>

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is conceivably reduced by the dehydration treatment (dehydrogenation treatment). For this reason, it is preferred that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by oxygen adding treatment, whereby the oxide semiconductor film can be transformed to an i-type (intrinsic) oxide semiconductor film or a substantially i-type (intrinsic) oxide semiconductor film that is extremely close to an i-type oxide semiconductor film. The term "substantially intrinsic" means that the oxide semiconductor film contains extremely few (close to zero) carriers derived from a donor and has a carrier density of lower than $8 \times 10^{11}/cm^3$, preferably lower than $1 \times 10^{11}/cm^3$, further preferably lower than $1 \times 10^{10}/cm^3$ and higher than or equal to $1 \times 10^{-9}/cm^3$.

<Structure of Oxide Semiconductor>

Next, a structure of an oxide semiconductor will be described.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis-aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is an oxide semiconductor film having a plurality of c-axis-aligned crystal parts.

When a combined analysis image (also referred to as high-resolution TEM image) of a bright-field image and a diffraction pattern of the CAAC-OS film is observed with a transmission electron microscope (TEM), a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When a CAAC-OS film, e.g., a CAAC-OS film including an $InGaZnO_4$ crystal, is subjected to structural analysis by an out-of-plane method with an X-ray diffraction (XRD) apparatus, a peak appears frequently at a diffraction angle (2θ) of around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an $InGaZnO_4$ crystal is analyzed by an out-of-plane method, a peak may also be observed at 2θ of around 36° as well as at 2θ of around 31°. The peak at 2θ of around 36° indicates that a crystal having no c-axis alignment is included in the CAAC-OS film. It is preferred that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. The impurity contained in the oxide semiconductor film may serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Note that charge trapped by the carrier traps in an oxide semiconductor film requires a long time to be released and might behave like fixed charge. Thus, a transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of the microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. For example, in a high-resolution TEM image of the nc-OS film, a grain boundary is not clearly observed in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, the nc-OS film cannot be distinguished from an amorphous oxide semiconductor film by some analysis methods. For example, when the nc-OS film is subjected to structural analysis by an out-of-plane method with an XRD apparatus using an X-ray having a diameter larger than the size of a crystal part, a peak showing a crystal plane does not appear. A diffraction pattern like a halo pattern appears in a selected-area electron diffraction pattern of the nc-OS film obtained by using an electron beam with a probe diameter larger than the size of a crystal part (e.g., with a probe diameter of 50 nm or larger). Meanwhile, spots are observed in a nanobeam electron diffraction pattern of the nc-OS film obtained by using an electron beam with a probe diameter close to or smaller than the size of a crystal part. Furthermore, in a nanobeam electron diffraction pattern of the nc-OS film, regions with high luminance in a circular (ring) pattern are shown or a plurality of spots are shown in a ring-like region in some cases.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts are not observed.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is sometimes observed. Furthermore, in the high-resolution TEM image, there are a region where a crystal part is clearly observed and a region where a crystal part is not observed. In the a-like OS film, crystallization occurs due to a slight amount of electron beam used for TEM observation and growth of the crystal part is found in some cases. In contrast, crystallization is scarcely observed in the nc-OS film having good quality when the electron-beam irradiation is carried out at a low intensity as in the TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing (also referred to as d value) on the (009) plane. The value is calculated to 0.29 nm from crystal structure analysis. Thus, focusing on the lattice fringes in the high-resolution TEM image, each of the lattice fringes having the spacing therebetween of 0.28 nm to 0.30 nm corresponds to the a-b plane of the $InGaZnO_4$ crystal.

The density of an oxide semiconductor film varies with its structure in some cases. For example, when the composition of an oxide semiconductor film becomes clear, the structure of the oxide semiconductor film can be estimated from density comparison between the oxide semiconductor film and a single crystal oxide semiconductor film having the same composition as the oxide semiconductor film. For example, the density of an a-like OS film is higher than or equal to 78.6% and lower than 92.3% of the density of a single crystal oxide semiconductor having the same composition. For example, the density of each of an nc-OS film and a CAAC-OS film is higher than or equal to 92.3% and lower than 100% of the density of a single crystal oxide semiconductor having the same composition. Note that it is difficult to deposit an oxide semiconductor film whose density is lower than 78% of the density of the single crystal oxide semiconductor film.

Specific examples of the above description are given. For example, in an oxide semiconductor film with an atomic ratio of In:Ga:Zn=1:1:1, the density of single crystal $InGaZnO_4$ with a rhombohedral crystal structure is 6.357 $g/cm^3$. Thus, for example, the density of an a-like OS film with an atomic ratio of In:Ga:Zn=1:1:1 is higher than or equal to 5.0 $g/cm^3$ and lower than 5.9 $g/cm^3$. Moreover, for example, the density of an nc-OS film or a CAAC-OS film with an atomic ratio of In:Ga:Zn=1:1:1 is higher than or equal to 5.9 $g/cm^3$ and lower than 6.3 $g/cm^3$.

Note that single crystals with the same composition do not exist in some cases. In such a case, combining single crystals with different compositions at a given proportion makes it possible to calculate a density that corresponds to the density of a single crystal with a desired composition. The density of the single crystal with a desired composition can be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve extremely favorable off-state current characteristics.

Embodiment 3

In this embodiment, a cross-sectional structure of a transistor included in a semiconductor device of one embodiment of the disclosed invention will be described with reference to drawings.

<Schematic Views of Cross-Sectional Structure>

First, schematic views of a cross-sectional structure of the semiconductor device of one embodiment of the present invention will be described with reference to FIGS. 11A and 11B.

Transistors included in the semiconductor device of one embodiment of the present invention are Si transistors and OS transistors. For example, the semiconductor device has a cross-sectional structure in which a layer including Si transistors and a layer including OS transistors are stacked. Each of the layers includes a plurality of transistors including a semiconductor layer of the same material.

Figure 11A:
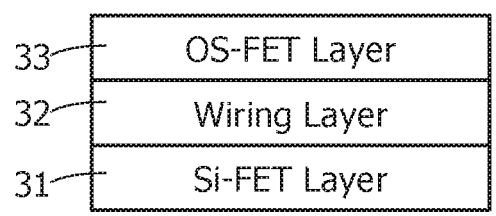
FIGS. 11A and 11B are schematic cross-sectional views each illustrating one embodiment of the present invention.

For example as illustrated in FIG. 11A, the semiconductor device of one embodiment of the present invention can be formed by stacking a layer 31 including Si transistors (represented as Si-FET Layer in FIG. 11A and hereinafter referred to as Si-FET layer 31), a layer 32 where wirings are provided (represented as Wiring Layer in FIG. 11A and hereinafter referred to as wiring layer 32), and a layer 33 including OS transistors (represented as OS-FET Layer in FIG. 11A and hereinafter referred to as OS-FET layer 33) in this order.

The Si-FET layer 31 in the schematic view of the cross-sectional structure in FIG. 11A includes Si transistors formed on a single crystal silicon substrate. Note that the Si transistors may be transistors including a thin semiconductor layer of silicon, germanium, or the like in an amorphous, microcrystalline, polycrystalline, or single crystal state.

The OS-FET layer 33 in the schematic view of the cross-sectional structure in FIG. 11A includes OS transistors formed on a planarized insulating surface.

The wiring layer 32 in the schematic view of the cross-sectional structure in FIG. 11A includes a wiring for electrically connecting transistors in the Si-FET layer 31 and/or the OS-FET layer 33, or includes a wiring for supplying voltage to the transistors. Although the wiring layer 32 is shown as a single layer in FIG. 11A, a plurality of layers 32 may be provided.

The OS-FET layer 33 is illustrated as a single layer in the schematic view of the cross-sectional structure in FIG. 11A. Alternatively, a plurality of OS-FET layers 33 may be provided; FIG. 11B is a schematic view of a cross-sectional structure in that case.

Figure 11B:
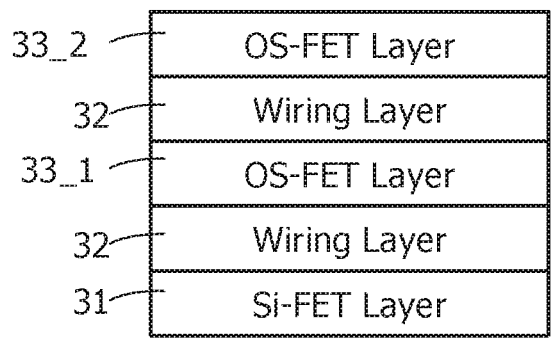

FIG. 11B illustrates a two-layer structure including a layer 33_1 including OS transistors (hereinafter referred to as OS-FET layer 33_1) and a layer 33_2 including OS transistors (hereinafter referred to as OS-FET layer 33_2). In the schematic view of the cross-sectional structure in FIG. 11B, the OS-FET layer 33_1 and the OS-FET layer 33_2 include OS transistors formed on a planarized insulating surface. Although the example of stacking two layers is shown in FIG. 11B, the number of stacked layers is not limited to two. The wiring layer 32 can be provided between the OS-FET layer 33_1 and the OS-FET layer 33_2. With this structure, the OS transistors can be electrically connected to each other.

The transistors M1a and M2a (M1b and M2b) described in FIG. 1 of Embodiment 1 are OS transistors and the transistor M3a (M3b) is a Si transistor. Thus, when the transistors in FIG. 1 are provided in the layers in FIGS. 11A and 11B, the transistor M3a (M3b) is provided in the Si-FET layer 31 and the transistors M1a and M2a (M1b and M2b) are provided in the OS-FET layers 33, 33_1, and 33_2. Stacking the layer including OS transistors (OS-FET layer) over the layer including Si transistors (Si-FET layer) as illustrated in FIGS. 11A and 11B enables a reduction in the circuit area of a memory cell, that is, a reduction in the chip area and size of the semiconductor device.

<Cross-Sectional Structure of Layer Including Si Transistors and Layer where Wirings are Provided>

Figure 12:
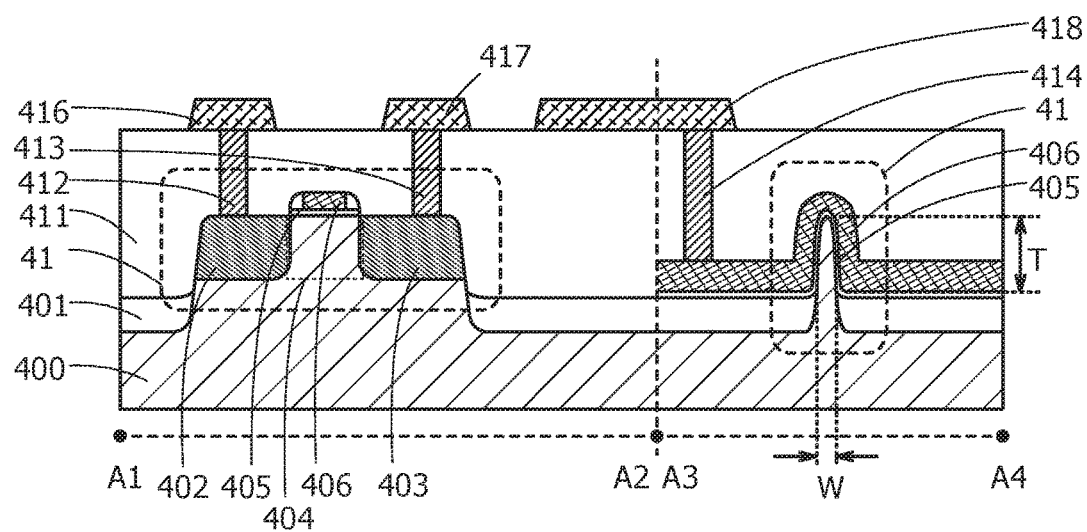
FIG. 12 is a schematic cross-sectional view illustrating one embodiment of the present invention.

FIG. 12 illustrates an example of a cross-sectional structure of the Si-FET layer 31 and the wiring layer 32, which are described with reference to FIGS. 11A and 11B. FIG. 12 specifically shows a cross-sectional structure of a transistor 41 included in the Si-FET layer 31. The cross-sectional structure of the transistor 41 in FIG. 12 can be applied to the transistor M3a (M3b) illustrated in FIG. 1 of Embodiment 1, for example.

In FIG. 12, a region along the dashed line A1-A2 shows the structure of the transistor 41 in the channel length direction, and a region along the dashed line A3-A4 shows the structure of the transistor 41 in the channel width direction.

In FIG. 12, a substrate 400 where the transistor 41 is formed can be, for example, a silicon substrate, a germanium substrate, or a silicon germanium substrate. FIG. 12 illustrates an example where a single crystal silicon substrate is used as the substrate 400.

The transistor 41 is electrically isolated by an element isolation method. An example of the element isolation method is a trench isolation method (shallow trench isolation: STI). FIG. 12 illustrates an example where the trench isolation method is used to electrically isolate the transistor 41. Specifically, in FIG. 12, the transistor 41 is electrically isolated by using an element isolation region 401 formed in such a manner that an insulator containing silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 41 and a channel formation region 404 placed between the impurity regions 402 and 403 are provided. The transistor 41 also includes an insulating film 405 covering the channel formation region 404 and a gate electrode 406 that overlaps the channel formation region 404 with the insulating film 405 placed therebetween.

In the transistor 41, the gate electrode 406 overlaps a side portion and an upper portion of the projection in the channel formation region 404, with the insulating film 405 positioned therebetween; thus, carriers flow in a wide area including a side portion and an upper portion of the channel formation region 404. Accordingly, the number of transferred carriers in the transistor 41 can be increased while an area over the substrate occupied by the transistor 41 is kept small. As a result, the on-state current and field-effect mobility of the transistor 41 are increased. Suppose the length of the projection of the channel formation region 404 in the channel width direction (i.e., channel width) is W and the thickness of the projection of the channel formation region 404 is T. When the aspect ratio of the thickness T to the channel width W is high, a region where carrier flows becomes wider. Thus, the on-state current of the transistor 41 can be further increased and the field-effect mobility of the transistor 41 can be further increased.

Note that when the transistor 41 is formed using a bulk semiconductor substrate, the aspect ratio is preferably 0.5 or higher, more preferably 1 or higher.

An insulating film 411 is provided over the transistor 41. Openings are formed in the insulating film 411. A conductive film 412, a conductive film 413, and a conductive film 414 that are electrically connected to the impurity region 402, the impurity region 403, and the gate electrode 406, respectively, are formed in the openings.

The conductive film 412 is electrically connected to a conductive film 416 over the insulating film 411. The conductive film 413 is electrically connected to a conductive film 417 over the insulating film 411. The conductive film 414 is electrically connected to a conductive film 418 over the insulating film 411.

Note that the wiring layer 32 illustrated in FIGS. 11A and 11B corresponds to the conductive films 416, 417, and 418 in FIG. 12. The wiring layer 32 can be stacked by forming an insulating film, an opening in the insulating film, and a conductive film in a region including the opening, in this order.

<Cross-Sectional Structure of Layer Including OS Transistors>

Figure 13A:
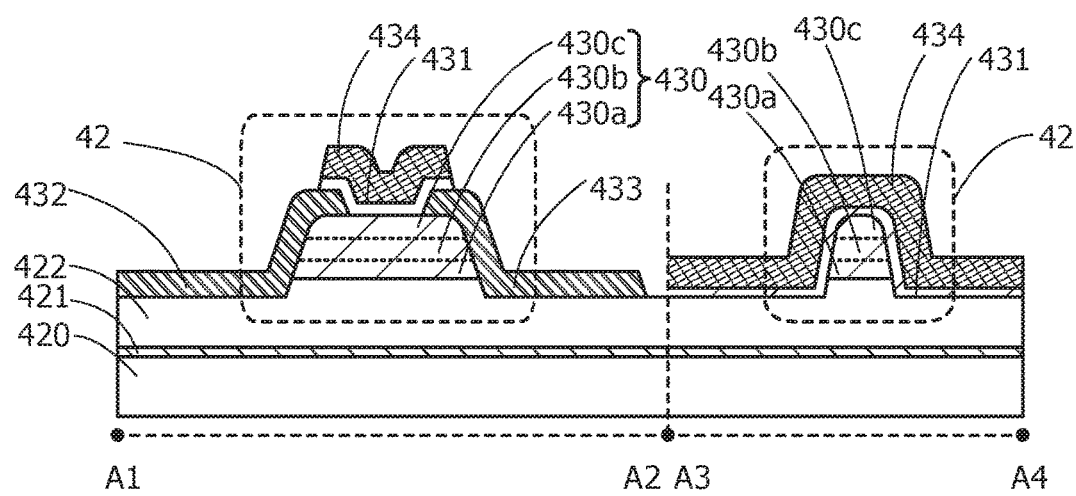
FIGS. 13A and 13B are schematic cross-sectional views each illustrating one embodiment of the present invention.
Figure 13B:
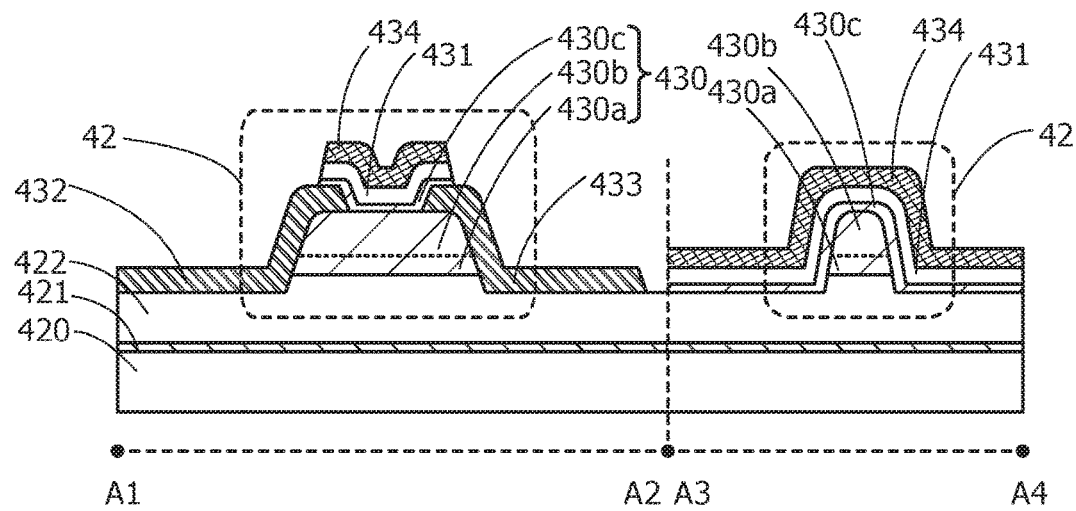

Next, FIGS. 13A and 13B illustrate an example of a cross-sectional structure of the OS-FET layer 33 described using FIGS. 11A and 11B. FIGS. 13A and 13B each specifically show a cross-sectional structure of a transistor 42 included in the OS-FET layer 33. The cross-sectional structures of the transistor 42 in FIGS. 13A and 13B can be applied to the transistors M1a and M2a (M1b and M2b) illustrated in FIG. 1 of Embodiment 1, for example.

In FIGS. 13A and 13B, as in FIG. 12, a region along the dashed line A1-A2 shows the structure of the transistor 42 in the channel length direction, and a region along the dashed line A3-A4 shows the structure of the transistor 42 in the channel width direction.

An insulating film 421 having a blocking effect of preventing diffusion of oxygen, hydrogen, and water is provided over an insulating film 420 that is provided over the wiring layer 32 described using FIGS. 11A and 11B. As the insulating film 421 has higher density and is denser or has a fewer dangling bonds and is more chemically stable, the insulating film 421 has a higher blocking effect. The insulating film 421 with an effect of blocking diffusion of oxygen, hydrogen, and water can be formed using aluminum oxide, aluminum oxynitride, gallium oxide, gallium oxynitride, yttrium oxide, yttrium oxynitride, hafnium oxide, or hafnium oxynitride, for example. The insulating film 421 with an effect of blocking diffusion of hydrogen and water can be formed using silicon nitride or silicon nitride oxide, for example.

An insulating film 422 is provided over the insulating film 421, and the transistor 42 is provided over the insulating film 422.

The transistor 42 includes, over the insulating film 422, a semiconductor film 430 containing an oxide semiconductor, conductive films 432 and 433 that function as source and drain electrodes and are electrically connected to the semiconductor film 430, a gate insulating film 431 covering the semiconductor film 430, and a gate electrode 434 overlapping the semiconductor film 430 with the gate insulating film 431 positioned therebetween.

Note that in FIG. 13A, the transistor 42 includes the gate electrode 434 on at least one side of the semiconductor film 430, and may also include a gate electrode that overlaps with the semiconductor film 430 with the insulating film 422 positioned therebetween.

When the transistor 42 includes a pair of gate electrodes, one of the gate electrodes may be supplied with a signal for controlling the on/off state, and the other of the gate electrodes may be supplied with a voltage from another wiring. In this case, voltages with the same level may be supplied to the pair of gate electrodes, or a fixed voltage such as the ground voltage may be supplied only to the other of the gate electrodes. By controlling a voltage supplied to the other of the gate electrodes, the threshold voltage of the transistor can be controlled.

In FIG. 13A, the transistor 42 has a single-gate structure where one channel formation region corresponding to one gate electrode 434 is provided. Alternatively, the transistor 42 may have a multi-gate structure where a plurality of gate electrodes electrically connected to each other are provided so that a plurality of channel formation regions are included in one active layer.

FIG. 13A illustrates an example in which the semiconductor film 430 included in the transistor 42 includes oxide semiconductor films 430a to 430c that are stacked in this order over the insulating film 422. Note that in one embodiment of the present invention, the semiconductor film 430 of the transistor 42 may be a single metal oxide film.

When the oxide semiconductor film 430b is an In-M-Zn oxide film (M is Ga, Y, Zr, La, Ce, or Nd) and a target having the atomic ratio of metal elements of In:M:Zn=$x_1$:$y_1$:$z_1$ is used to form the oxide semiconductor film 430b, $x_1/y_1$ is preferably greater than or equal to 1/3 and less than or equal to 6, further preferably greater than or equal to 1 and less than or equal to 6, and $z_1/y_1$ is preferably greater than or equal to 1/3 and less than or equal to 6, further preferably greater than or equal to 1 and less than or equal to 6. Note that when $z_1/y_1$ is greater than or equal to 1 and less than or equal to 6, a CAAC-OS film is easily formed as the oxide semiconductor film 430b. Typical examples of the atomic ratio of the metal elements of the target are In:M:Zn=1:1:1 and 3:1:2.

When the oxide semiconductor films 430a and 430c are In-M-Zn oxide films (M represents Ga, Y, Zr, La, Ce, or Nd) and a target having the atomic ratio of metal elements of In:M:Zn=$x_2$:$y_2$:$z_2$ is used to form the oxide semiconductor films 430a and 430c, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 430a and 430c. Typical examples of the atomic ratio of the metal elements of the target are In:M:Zn=1:3:2, 1:3:4, and 1:3:6.

The insulating film 422 preferably has a function of supplying part of oxygen contained therein to the oxide semiconductor films 430a to 430c by heating. The insulating film 422 preferably has few defects, and typically, the spin density at g=2.001 due to a dangling bond of silicon is preferably lower than or equal to $1 \times 10^{18}$ spins/cm$^3$ when measured by electron spin resonance (ESR) spectroscopy.

The insulating film 422, which has a function of supplying part of oxygen contained therein to the oxide semiconductor films 430a to 430c by heating, is preferably oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma chemical vapor deposition (CVD) method, a sputtering method, or the like.

Note that in this specification, oxynitride refers to a material that contains more oxygen than nitrogen, and nitride oxide refers to a material that contains more nitrogen than oxygen.

Note that in the transistor 42 illustrated in FIG. 13A, the gate electrode 434 overlaps end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or the like generated from an etching gas are easily bonded to a metal element contained in an oxide semiconductor. For this reason, in the end portions of the oxide semiconductor film, oxygen bonded to the metal element is easily eliminated; thus, it is possible that an oxygen vacancy is easily formed and the oxide semiconductor film easily has n-type conductivity. However, in the transistor 42 of FIG. 13A, an electric field applied to the end portions can be controlled by controlling the voltage of the gate electrode 434 because the end portions of the oxide semiconductor film 430b that do not overlap with the conductive films 432 and 433 overlap with the gate electrode 434. Consequently, current that flows between the conductive films 432 and 433 through the end portions of the oxide semiconductor film 430b can be controlled by the voltage applied to the gate electrode 434. Such a structure of the transistor 42 is referred to as a surrounded channel (s-channel) structure.

With the s-channel structure, when a voltage at which the transistor 42 is turned off is supplied to the gate electrode 434, the amount of off-state current that flows between the conductive films 432 and 433 through the end portions of the oxide semiconductor film 430b can be reduced. For this reason, even when the distance between the conductive films 432 and 433 at the end portions of the oxide semiconductor film 430b is reduced in the transistor 42 as a result of decreasing the channel length to obtain high on-state current, the transistor 42 can have low off-state current. Consequently, with a short channel length, the transistor 42 can have high on-state current and low off-state current.

With the s-channel structure, when a voltage at which the transistor 42 is turned on is supplied to the gate electrode 434, the amount of current that flows between the conductive films 432 and 433 through the end portions of the oxide semiconductor film 430b can be increased. The current contributes to an increase in the field-effect mobility and on-state current of the transistor 42. With the overlap of the end portions of the oxide semiconductor film 430b and the gate electrode 434, carriers flow in a wide region of the oxide semiconductor film 430b without being limited to a region in the vicinity of the interface of the oxide semiconductor film 430b close to the gate insulating film 431. This results in an increase in the number of carriers transferred in the transistor 42. Thus, the on-state current and field-effect mobility of the transistor 42 are increased, and the field-effect mobility is increased to 10 $cm^2/Vs$ or higher or 20 $cm^2/Vs$ or higher, for example. Note that here, the field-effect mobility is not an approximate value of the mobility as the physical property value of the oxide semiconductor film but the apparent field-effect mobility in a saturation region of the transistor, which is an index of current drive capability.

Note that FIG. 13A illustrates the structure where the semiconductor film 430 in the transistor 42 includes the oxide semiconductor films 430a to 430c stacked in this order. The semiconductor film 430 may also have a structure illustrated in FIG. 13B. As illustrated in FIG. 13B, the oxide semiconductor film 430c included in the semiconductor film 430 may be provided over the conductive films 432 and 433 and overlap with the gate insulating film 431.

<Cross-Sectional Structure of Stack of Layer Including Si Transistors and Layer Including OS Transistors>

Figure 14:
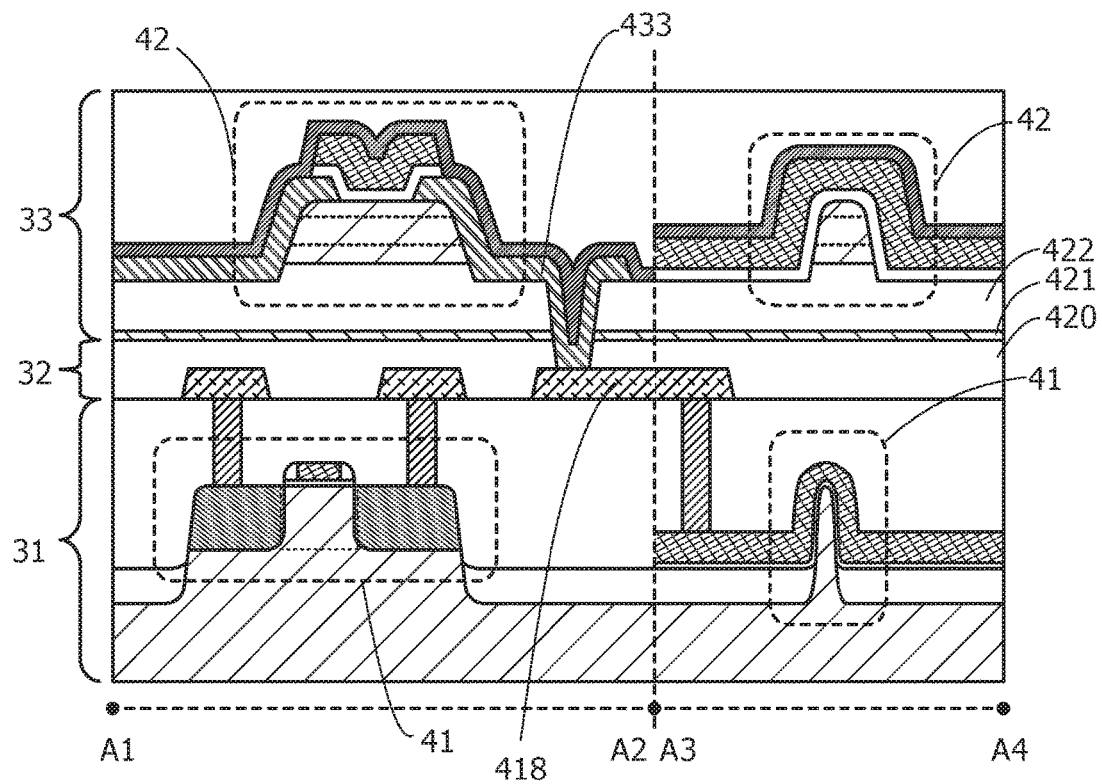
FIG. 14 is a schematic cross-sectional view illustrating one embodiment of the present invention.
Figure 15:
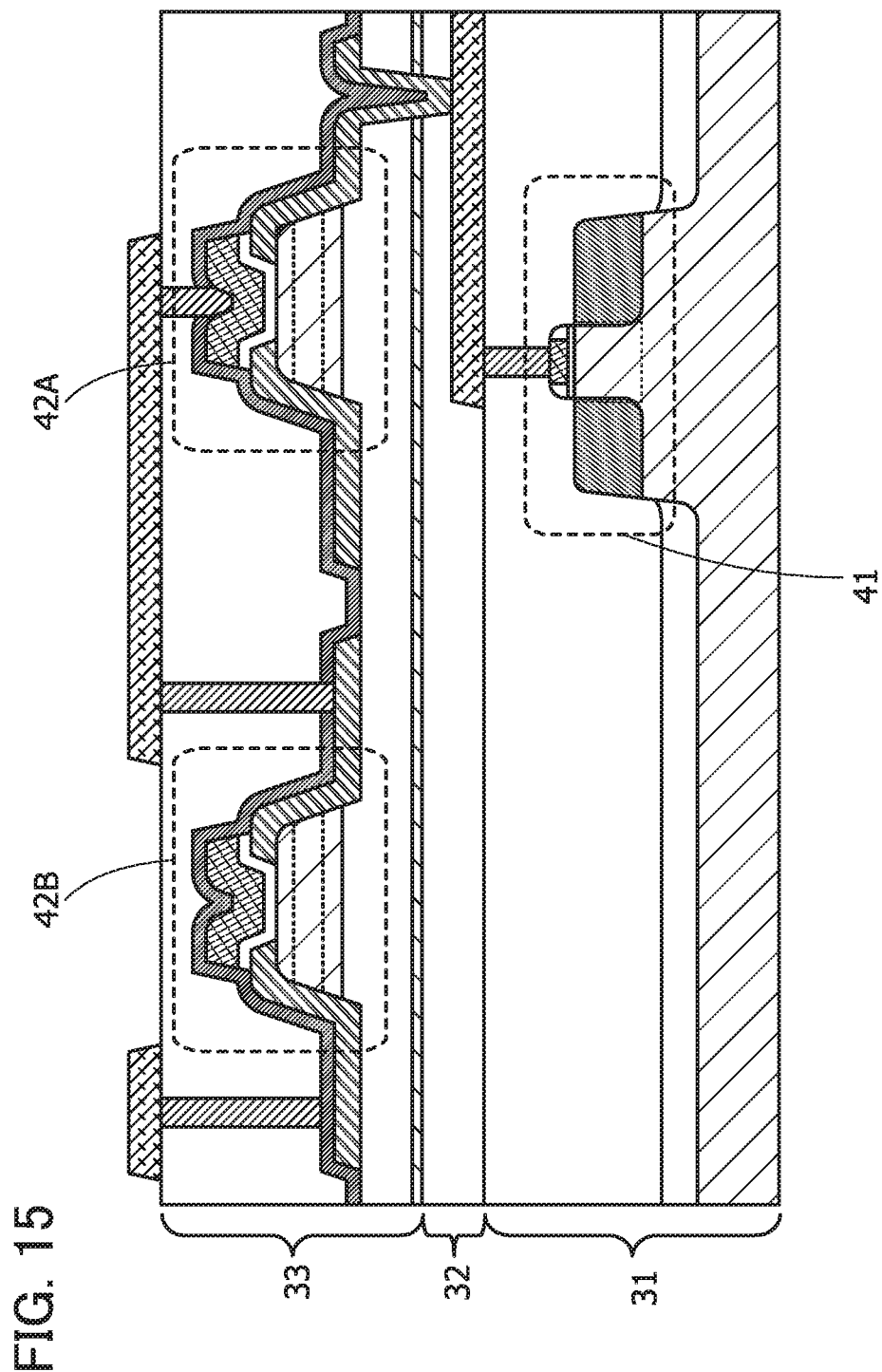
FIG. 15 is a schematic cross-sectional view illustrating one embodiment of the present invention.
Figure 16:
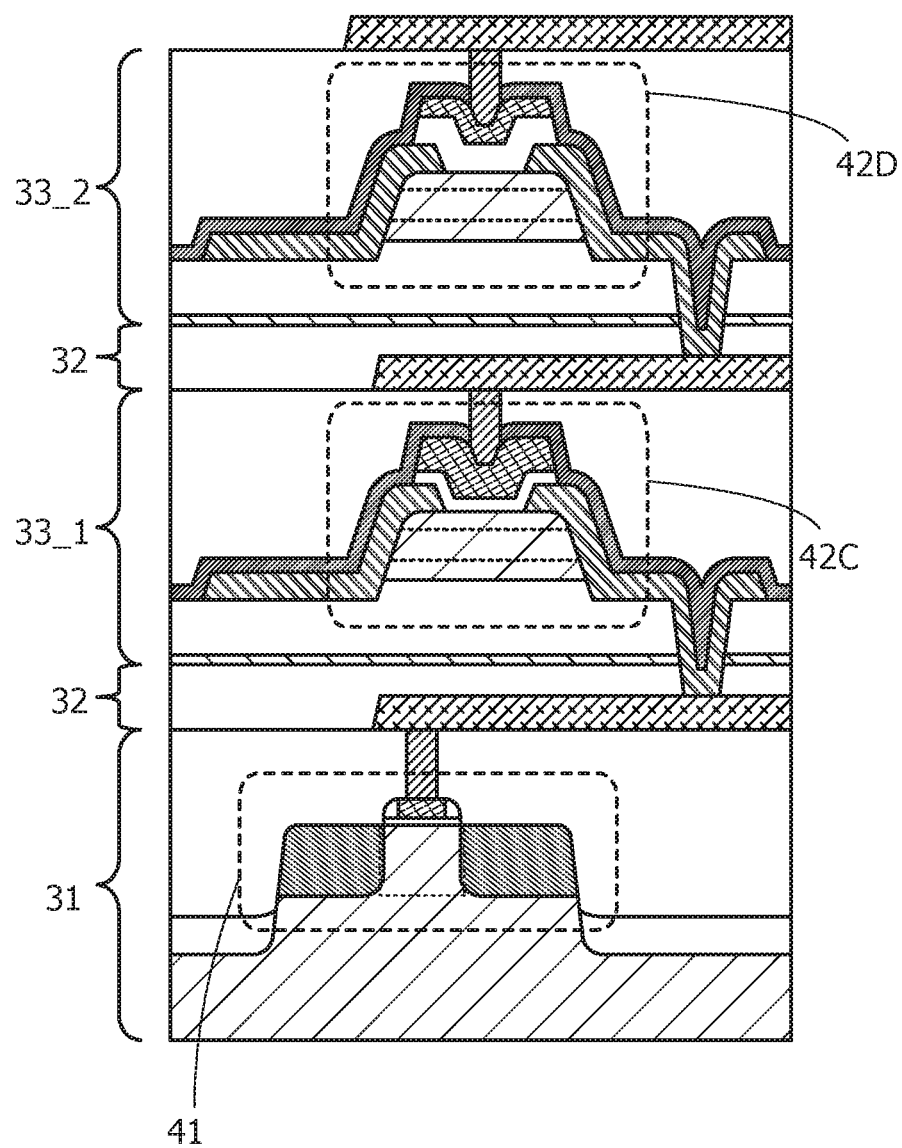
FIG. 16 is a schematic cross-sectional view illustrating one embodiment of the present invention.

Next, FIGS. 14 to 16 illustrate examples of a cross-sectional structure of stacking the Si-FET layer 31 and the wiring layer 32 are provided, described with FIG. 12, and the OS-FET layer 33, described with FIG. 13A.

FIG. 14 illustrates an example of a cross-sectional structure corresponding to the schematic view in FIG. 11A.

In FIG. 14, as in FIG. 12 and FIGS. 13A and 13B, a region along the dashed line A1-A2 shows the structure of the transistors 41 and 42 in the channel length direction, and a region along the dashed line A3-A4 shows the structure of the transistors 41 and 42 in the channel width direction.

Note that unlike in FIG. 14, the channel length direction of the transistor 41 and that of the transistor 42 may not be necessarily consistent with each other in one embodiment of the present invention.

In FIG. 14, an opening is provided in the insulating films 420 to 422 to electrically connect the transistor 41 and the transistor 42. The conductive film 433 provided in the opening is connected to the conductive film 418 through the opening.

In the cross-sectional structure illustrated in FIG. 14, as has been described for FIG. 11A, the transistor 42 including a channel formation region in an oxide semiconductor film is formed over the transistor 41 including a channel formation region in a single crystal silicon substrate. With the structure illustrated in FIG. 14, the channel formation region of the transistor 42 can overlap the channel formation region of the transistor 41. Accordingly, a semiconductor device including a memory cell with such a structure can have a reduced layout area.

Note that when the transistor 42 provided in the OS-FET layer 33 is used as the transistors M1a and M2a (M1b and M2b) illustrated in FIG. 1 of Embodiment 1, the transistors M1a and M2a (M1b and M2b) may be provided in the same layer or different layers.

For example, to provide a plurality of transistors 42 in one OS-FET layer 33, a structure illustrated in FIG. 15 can be employed. To provide a plurality of transistors 42 in different OS-FET layers 33, a structure illustrated in FIG. 16 can be employed in which the OS-FET layer 33_1 and the OS-FET layer 33_2 are stacked with the wiring layer 32 placed therebetween.

In the case of employing the cross-sectional structure in FIG. 15, even when the number of OS transistors is increased, only one OS-FET layer 33 is required. Thus, the number of stacked layers is not increased. For example, a transistor 42A and a transistor 42B in FIG. 15 can be concurrently formed. Accordingly, the number of steps for manufacturing a semiconductor device can be reduced.

FIG. 15 illustrates the structure of the transistors 41, 42A, and 42B in the channel length direction. Their structure in the channel width direction is similar to that illustrated in FIG. 14, and the aforementioned structure can be referred to.

By applying the cross-sectional structure of FIG. 15 to the transistors described in Embodiment 1, the transistors 42A and 42B can be formed as the transistors M1a and M2a (M1b and M2b). Thus, manufacturing cost of the semiconductor devices can be reduced.

With the cross-sectional structure in FIG. 16, even when the number of OS transistors is increased, the OS transistors can be provided in a plurality of layers such as the OS-FET layers 33_1 and 33_2. Accordingly, the increase in circuit area due to the increased number of transistors can be prevented. Consequently, the chip area and size of the semiconductor device can be reduced.

FIG. 16 illustrates the structure of the transistor 41, a transistor 42C, and a transistor 42D in the channel length direction. Their structure in the channel width direction is similar to that illustrated in FIG. 14, and the aforementioned structure can be referred to.

By applying the cross-sectional structure of FIG. 16 to the transistors described in Embodiment 1, the transistors 42C and 42D can be formed as the transistors M1a and M2a (M1*b* and M2*b*). With the cross-sectional structure in FIG. 16, the film thickness, film quality, or the like in the OS transistors can vary between the OS-FET layer 33_1 and the OS-FET layer 33_2. Thus, transistors with different characteristics can be fabricated separately. For example, transistors with high switching characteristics due to thin gate insulating films and transistors with high withstand voltage due to thick gate insulating films can be stacked. Accordingly, the semiconductor device can have high performance.

Embodiment 4

Figure 17:
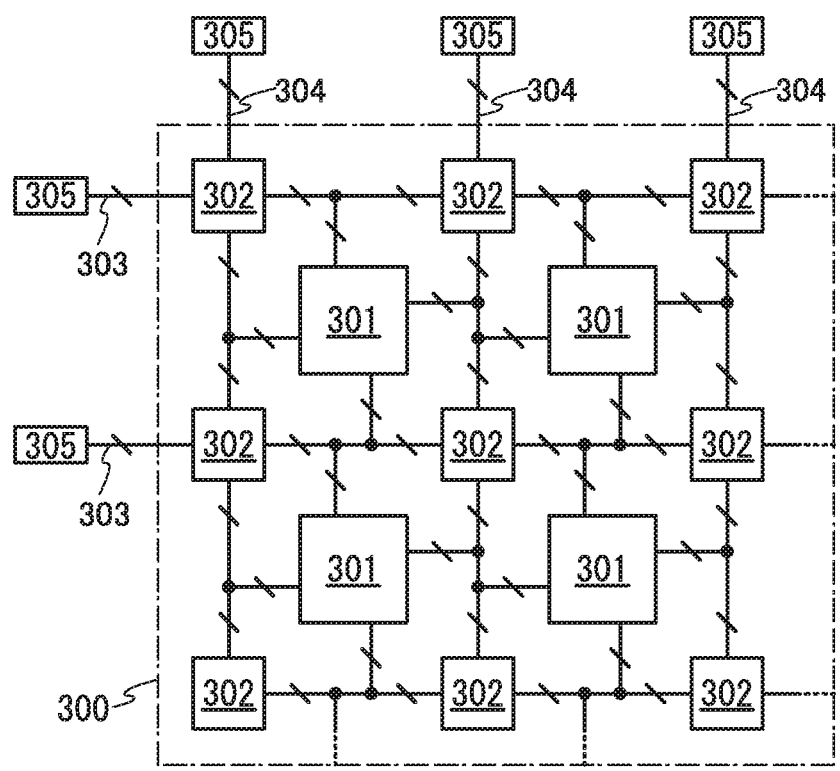
FIG. 17 is a block diagram illustrating a specific example of a semiconductor device.

This embodiment will explain an application example of a semiconductor device in a PLD. FIG. 17 shows an example of a block diagram of a logic array included in a PLD. A logic array 300 includes a plurality of logic elements (LEs) 301 arranged in an array. Here, the expression "arranged in an array" means that the logic elements are arranged in a matrix at regular intervals, and the arrangement is not limited to that illustrated in FIG. 17. A semiconductor device described in this embodiment functions as a register in the PLD.

A plurality of wirings are formed to surround the LEs 301. In FIG. 17, these wirings consist of a plurality of horizontal wiring groups 303 and a plurality of vertical wiring groups 304. A wiring group is a bundle of wirings. A switch portion 302 is provided at an intersection of the horizontal wiring group 303 and the vertical wiring group 304. The horizontal wiring groups 303 and the vertical wiring groups 304 are connected to input/output terminals 305 to transmit and receive signals to and from a circuit provided outside the logic array 300.

Input/output terminals of the plurality of LEs 301 are connected to the horizontal wiring groups 303 and the vertical wiring groups 304 provided around the LEs 301. For example, in FIG. 17, the input/output terminals of the LE 301 are connected to the horizontal wiring groups 303 and the vertical wiring groups 304 on the left, right, top, and bottom sides. With the use of these input/output terminals, each of the LEs 301 can be connected to another LE 301. A connection path between one LE 301 and another LE 301 is determined by a switch provided in the switch portion 302 to switch connection between wirings.

The on/off state of the switch in the switch portion 302 for switching connection between wirings is determined by a configuration memory that stores configuration data. The configuration memory with a rewritable structure, which is provided in the switch portion 302, preferably includes a nonvolatile memory element to prevent stored configuration data from being lost by stop of supply of power supply voltage.

Figure 18:
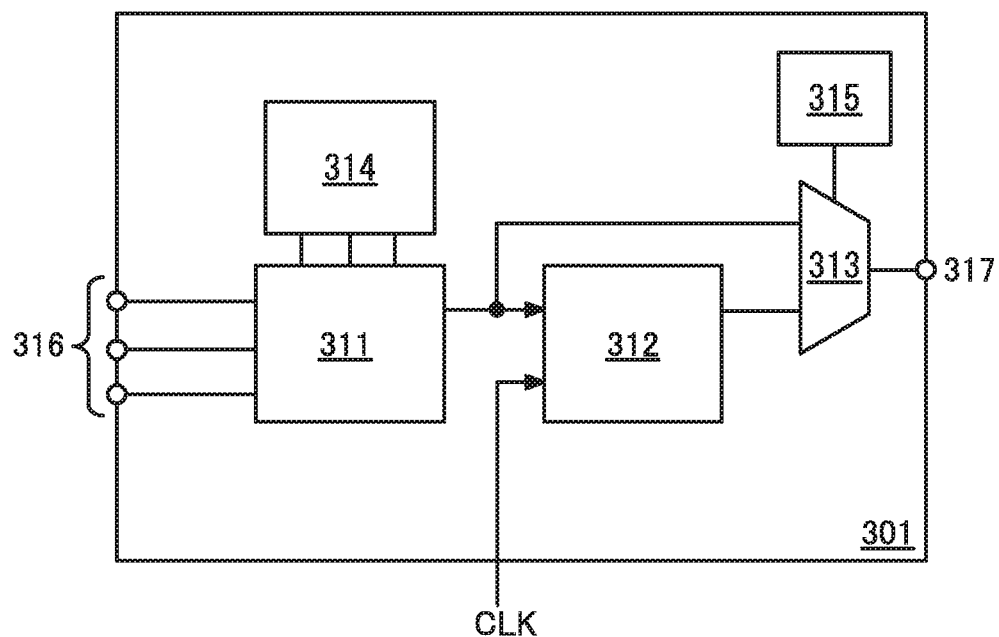
FIG. 18 is a block diagram illustrating a specific example of a semiconductor device.

FIG. 18 is a block diagram of the LE 301 illustrated in FIG. 17. The LE 301 in FIG. 18 includes a lookup table (LUT) 311, a flip-flop 312, and a multiplexer 313, for example. Moreover, configuration memories 314 and 315 connected to the LUT 311 and the multiplexer 313, respectively, are provided in FIG. 18.

The configuration memories 314 and 315 with a rewritable structure each preferably include a nonvolatile memory element to prevent stored configuration data from being lost by stop of supply of power supply voltage.

Configuration data refers to data of the LUT 311, information on selection of input signals of the multiplexer 313, and data on the on/off state of the switch portion 302, for example. A configuration memory refers to a memory element for storing configuration data.

A logic circuit determined by the LUT 311 varies depending on the content of configuration data stored in the configuration memory 314. When the configuration data is determined, one output value of the LUT 311 with respect to input values of a plurality of input signals supplied to input terminals 316 is determined. Then, the LUT 311 outputs a signal including the output value.

The flip-flop 312 holds the signal output from the LUT 311 and outputs an output signal corresponding to the signal to the multiplexer 313 in synchronization with a clock signal CLK.

The output signal from the LUT 311 and the output signal from the flip-flop 312 are input to the multiplexer 313. The multiplexer 313 outputs one of the two output signals in accordance with configuration data stored in the configuration memory 315. The output signal from the multiplexer 313 is output from an output terminal 317.

In one embodiment of the present invention, the semiconductor device described in the foregoing embodiment is used for a circuit for temporarily storing data, such as the flip-flop 312, thereby preventing loss of data in the flip-flop caused by stop of the supply of power supply voltage. Furthermore, data held before stop of the supply of power supply voltage can be saved in a short time, and the data can be returned in a short time after the supply of power supply voltage is restarted. Thus, the supply of power supply voltage can be stopped in a plurality of logic elements included in the PLD. Accordingly, power consumption of the PLD can be low.

Embodiment 5

Figure 19:
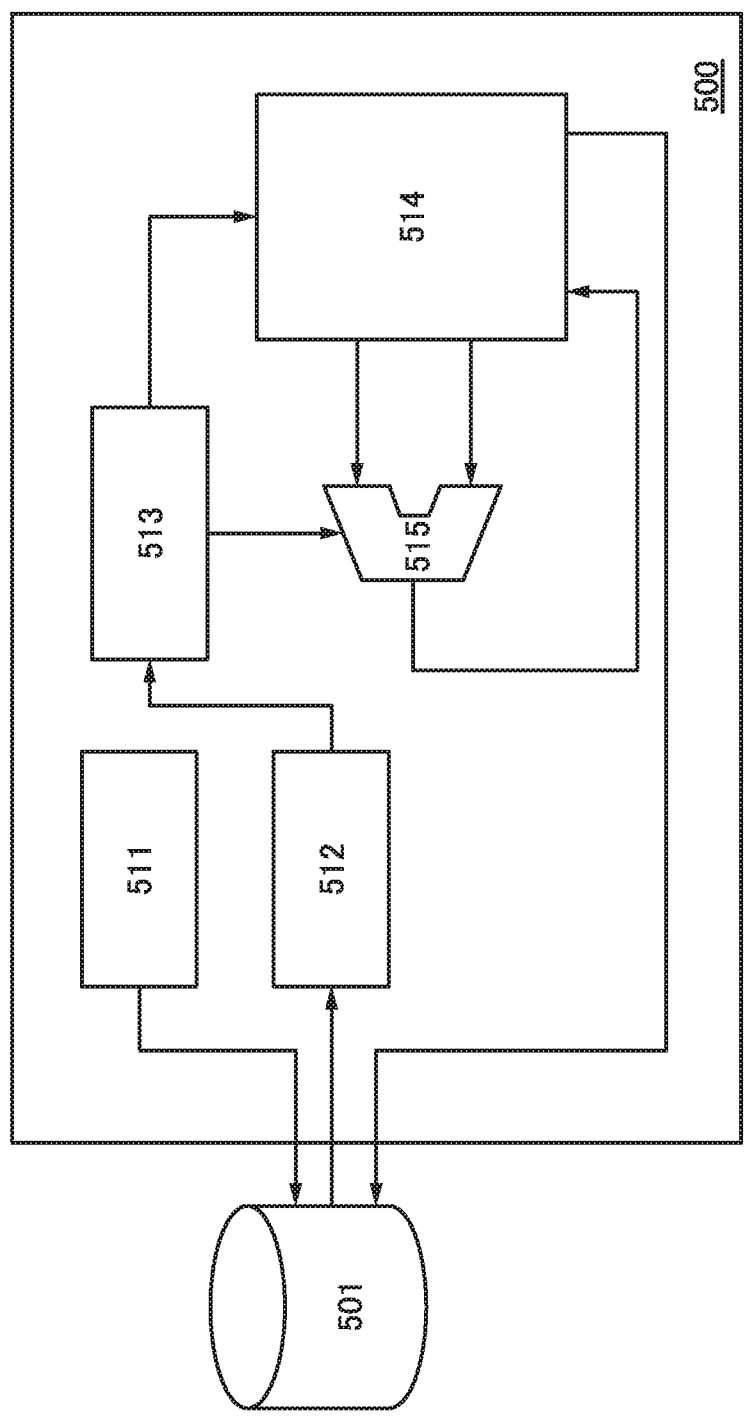
FIG. 19 is a block diagram illustrating a specific example of a semiconductor device.

This embodiment will explain an application example of a semiconductor device in a CPU. FIG. 19 illustrates an example of a block diagram of a CPU. A semiconductor device described in this embodiment functions as a register in the CPU.

A CPU 500 includes a program counter 511, an instruction register 512, an instruction decoder 513, a general-purpose register 514, and an arithmetic logic unit (ALU) 515, for example. A main memory device 501 for inputting and outputting data to and from the CPU 500 is provided outside the CPU 500.

The program counter 511 is a register that stores an address of an instruction (command) to be read (fetched). The instruction register 512 temporarily stores data transmitted to the instruction decoder 513 from the main memory device 501. The instruction decoder 513 is a circuit that decodes input data and generates signals for specifying a register in the general-purpose register 514, a signal for specifying an arithmetic method in the ALU 515, and the like. The general-purpose register 514 can store data read from the main memory device 501, data obtained during arithmetic operations in the ALU 515, data obtained as a result of arithmetic operations in the ALU 515, or the like. The ALU 515 has a function of performing a variety of arithmetic operations such as four arithmetic operations and logic operations. In the CPU 500, a data cache or the like, that is, a circuit for temporarily storing an arithmetic result or the like, may be additionally provided.

Next, the operation of the CPU 500 will be described.

The CPU 500 gives an instruction to output an address of an instruction that is specified by the program counter 511 to be read out, to the main memory device 501. Next, data is read from the address of the instruction to be carried out, which is stored in the main memory device 501, and is stored in the instruction register 512.

The instruction decoder 513 decodes the data stored in the instruction register 512, so that the instruction is executed. Specifically, the instruction decoder 513 generates a signal for specifying a register in the general-purpose register 514, a signal for specifying an arithmetic method in the ALU 515, and the like.

The general-purpose register 514 outputs the data, which is specified by the instruction decoder 513, to the ALU 515 or the main memory device 501 in accordance with the instruction. The ALU 515 carries out arithmetic operations in accordance with an arithmetic method specified by the instruction decoder 513, and an arithmetic result is stored in the general-purpose register 514.

After executing the instruction, the CPU 500 repeats the following operations: reading an instruction, decoding data read from the instruction register 512, and carrying out the instruction.

In one embodiment of the present invention, the semiconductor device shown in the foregoing embodiment is used for registers for temporarily storing data, such as the program counter 511, the instruction register 512, the instruction decoder 513, and the general-purpose register 514, thereby preventing loss of data in the registers caused by stop of the supply of power supply voltage. Furthermore, data held before stop of the supply of power supply voltage can be saved in a short time, and the data can be returned in a short time after the supply of power supply voltage is restarted. Thus, in the entire CPU 500 or the circuits included in the CPU 500, the supply of power supply voltage can be stopped. Accordingly, power consumption of the CPU 500 can be low.

Figure 20:
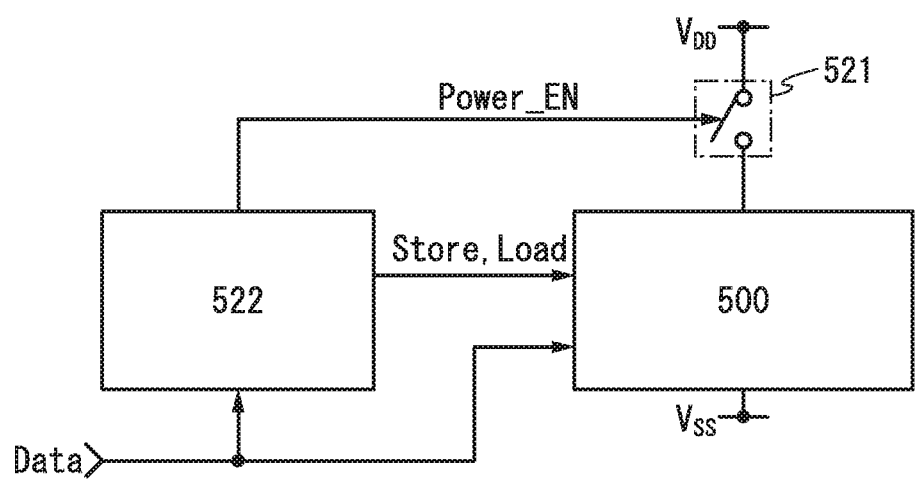
FIG. 20 is a block diagram illustrating a specific example of a semiconductor device.

FIG. 20 illustrates an example of a structure for stopping or restarting the supply of power supply voltage to the CPU 500. FIG. 20 illustrates the CPU 500, a power switch 521, and a power supply control circuit 522.

The power switch 521 can control stop or restart of the supply of power supply voltage to the CPU 500 in accordance with its on state or off state. Specifically, the power supply control circuit 522 outputs a power control signal Power_EN for turning on or off the power switch 521 to control stop or restart of the supply of power supply voltage to the CPU 500. By turning on the power switch 521, power supply voltage is supplied to the CPU 500 through wirings to which the voltages $V_{DD}$ and $V_{SS}$ are supplied. By turning off the power switch 521, a path of current between the wirings to which the voltages $V_{DD}$ and $V_{SS}$ are supplied is cut, so that the supply of power supply voltage to the CPU 500 is stopped.

The power supply control circuit 522 has a function of collectively controlling operations of the power switch 521 and the CPU 500 in accordance with the frequency of input of data Data. Specifically, the power supply control circuit 522 outputs a power control signal Power_EN for turning on or off the power switch 521 and control signals Store and Load for controlling data that is saved and returned in the semiconductor device. As described above, the control signals Store and Load enable potentials in the semiconductor device to be saved and returned between the volatile circuit and the nonvolatile circuit.

Next, an example of operations of the CPU 500, the power switch 521, and the power supply control circuit 522 illustrated in FIG. 20 will be described.

Whether the supply of power supply voltage is continued, stopped, or restarted is determined in accordance with the frequency of input of the data Data to the power supply control circuit 522. Specifically, when the data Data is continuously input to the CPU 500, the power supply control circuit 522 outputs the power control signal so that the supply of power supply voltage is continued. When the data Data is intermittently input to the CPU 500, based on timing at which the data Data is input, the power supply control circuit 522 outputs the power control signal so that the supply of power supply voltage is stopped or restarted.

The power supply control circuit 522 is preferably configured to be continuously supplied with power supply voltage even while the supply of power supply voltage to the CPU 500 is stopped. With this structure, the supply of power supply voltage to the CPU 500 can be stopped or restarted at desired timing.

Embodiment 6

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are mobile phones, game machines including portable game machines, portable information appliances, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), and vending machines. FIGS. 21A to 21F illustrate specific examples of these electronic devices.

Figure 21A:
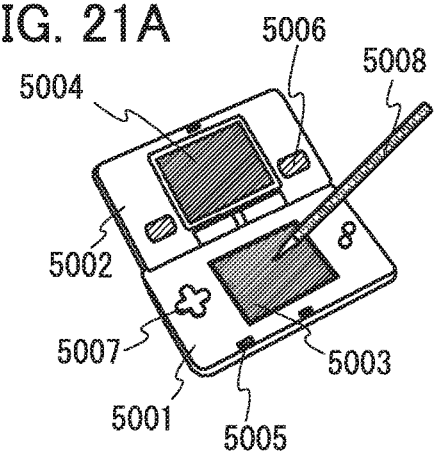
FIGS. 21A to 21F each illustrate an example of an electronic device.

FIG. 21A illustrates a portable game machine including a housing 5001, a housing 5002, a display portion 5003, a display portion 5004, a microphone 5005, speakers 5006, an operation key 5007, a stylus 5008, and the like. Although the portable game machine in FIG. 21A has the two display portions 5003 and 5004, the number of display portions included in the portable game machine is not limited to two.

Figure 21B:
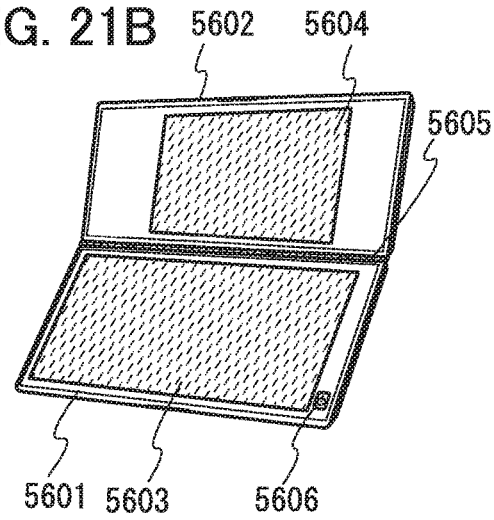

FIG. 21B illustrates a portable information appliance including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element (also referred to as photosensor) in a pixel portion of a display device.

Figure 21C:
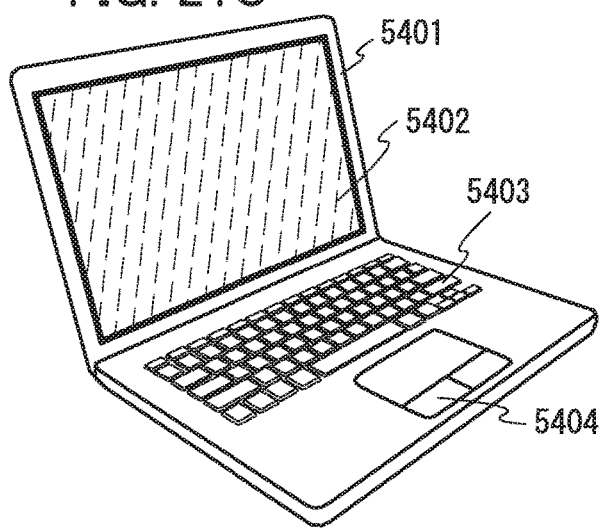

FIG. 21C illustrates a notebook personal computer including a housing 5401, a display portion 5402, a keyboard 5403, a pointing device 5404, and the like.

Figure 21D:
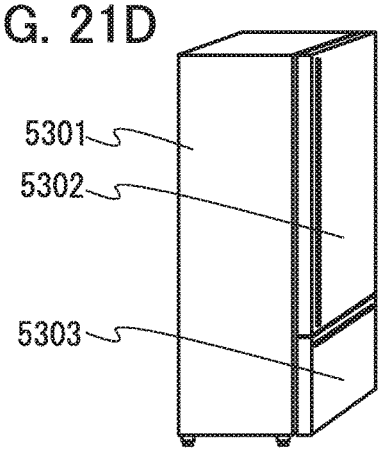

FIG. 21D illustrates an electric refrigerator-freezer including a housing 5301, a refrigerator door 5302, a freezer door 5303, and the like.

Figure 21E:
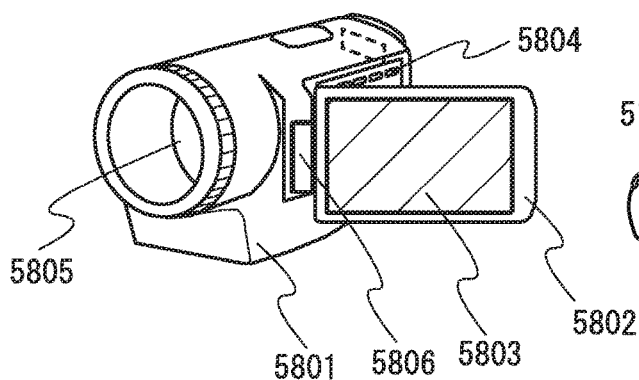

FIG. 21E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images on the display portion 5803 may be switched depending on the angle between the first housing 5801 and the second housing 5802 at the joint 5806.

Figure 21F:
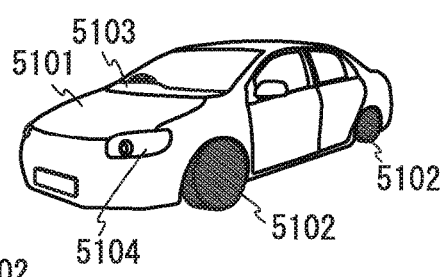

FIG. 21F illustrates a car including a car body 5101, wheels 5102, a dashboard 5103, lights 5104, and the like.

(Supplementary Notes on Description in this Specification and the Like)

The following are notes on the description of the foregoing embodiments and the structures in the embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

Notes on Description for Drawings

In this specification and the like, terms for describing arrangement, such as "over," "above," "under," and "below," are used for convenience to indicate a positional relation between components with reference to drawings. The positional relation between components is changed as appropriate in accordance with a direction in which the components are described. Therefore, the terms for explaining arrangement are not limited to those used in this specification and can be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can also mean the case where another component is placed between the insulating layer A and the electrode B.

Furthermore, in a block diagram in this specification and the like, components are functionally classified and shown by blocks that are independent of each other. However, in an actual circuit and the like, it may be difficult to separate components in accordance with their functions, and there is a case where one circuit is associated with a plurality of functions or a case where a plurality of circuits are associated with one function. Therefore, the segmentation of blocks in a block diagram is not limited by any of the components described in the specification.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as top views (also referred to as plan views or layout views) and perspective views, some of components might not be illustrated for clarity of the drawings.

<Notes on Expressions that can be Rephrased>

In this specification and the like, the terms "one of a source and a drain" (or first electrode or first terminal) and "the other of the source and the drain" (or second electrode or second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a plurality of electrodes or wirings formed in an integrated manner.

In this specification and the like, "voltage" and "potential" can be replaced with each other. The term "voltage" refers to a potential difference from a reference potential. Given that the reference potential is a ground potential, for example, "voltage" can be replaced with "potential." The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

Notes on Definitions of Terms

The following are definitions of the terms that are not mentioned in the above embodiments.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, any element can be used as a switch as long as it can control current, without limitation to a certain element.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the "on state" of the transistor refers to a state in which a source and a drain of the transistor are regarded as being electrically short-circuited. The "off state" of the transistor refers to a state in which the source and the drain of the transistor are regarded as being electrically disconnected. In the case where a transistor operates just as a switch, there is no particular limitation on the polarity (conductivity type) of the transistor.

An example of a mechanical switch is a switch formed using a microelectromechanical system (MEMS) technology, such as a digital micromirror device (DMD). Such a switch includes an electrode that can be moved mechanically, and its conduction and non-conduction is controlled with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same. That is, the channel length of one transistor is not limited to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed.

In one transistor, channel widths in all regions are not necessarily the same. That is, the channel width of one transistor is not limited to one value in some cases. Therefore, in this specification, a channel width is any one of values, the maximum value, the minimum value, or the average value in a region where a channel is formed.

Note that in some transistor structures, a channel width in a region where a channel is actually formed (hereinafter referred to as effective channel width) is different from a channel width shown in a top view of a transistor (hereinafter referred to as apparent channel width). For example, in a transistor having a three-dimensional structure, an effective channel width is larger than an apparent channel width shown in a top view of the transistor, and its influence cannot be ignored in some cases. For example, in a miniaturized transistor having a three-dimensional structure, the proportion of a channel region formed on a side surface of a semiconductor is sometimes high. In that case, an effective channel width obtained when a channel is actually formed is larger than an apparent channel width shown in the top view.

In a transistor having a three-dimensional structure, an effective channel width is difficult to measure in some cases. For example, estimation of an effective channel width from a design value requires an assumption that the shape of a semiconductor is known. Thus, in the case where the shape of a semiconductor is not known accurately, it is difficult to measure an effective channel width accurately.

In view of this, in this specification, an apparent channel width, which is the length of a portion where a source and a drain face each other in a region where a semiconductor and a gate overlap with each other in a top view of a transistor, is sometimes referred to as a surrounded channel width (SCW). Furthermore, in this specification, the term "channel width" may denote a surrounded channel width or an apparent channel width, or may denote an effective channel width. Note that the values of a channel length, a channel width, an effective channel width, an apparent channel width, a surrounded channel width, and the like can be determined by obtaining and analyzing a cross-sectional TEM image and the like.

In the case where electric field mobility, a current value per channel width, and the like of a transistor are obtained by calculation, a surrounded channel width may be used for the calculation. In that case, a value different from one when an effective channel width is used for the calculation is obtained in some cases.

<<Connection>>

In this specification and the like, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

This application is based on Japanese Patent Application serial no. 2015-163432 filed with Japan Patent Office on Aug. 21, 2015, the entire contents of which are hereby incorporated by reference.

What is claimed is:

1. A semiconductor device comprising:
a first circuit including a flip-flop; and
a second circuit comprising a first transistor, a second transistor, and a third transistor,
wherein:
the first circuit is configured to retain data while a power supply voltage is supplied,
the second circuit is configured to retain the data while the power supply voltage is not supplied,
each of the first transistor and the second transistor comprises a channel formation region including an oxide semiconductor,
the third transistor comprises a channel formation region including silicon,
a gate of the second transistor is electrically connected to one of a source and a drain of the first transistor,
a gate of the third transistor is electrically connected to one of a source and a drain of the second transistor, and
the first circuit is electrically connected to one of a source and a drain of the third transistor and the other of the source and the drain of the first transistor.

2. A semiconductor device comprising:
a first circuit including a flip-flop; and
a second circuit comprising a first transistor, a second transistor, and a third transistor,
wherein:
the first circuit is configured to retain data while a power supply voltage is supplied,
the second circuit is configured to retain the data while the power supply voltage is not supplied,
each of the first transistor and the second transistor comprises a channel formation region including an oxide semiconductor,
a gate of the first transistor is configured to be supplied with a first control signal for saving the data from the first circuit to the second circuit,
the third transistor comprises a channel formation region including silicon,
a gate of the second transistor is electrically connected to one of a source and a drain of the first transistor,
a gate of the third transistor is electrically connected to one of a source and a drain of the second transistor,
the other of the source and the drain of the second transistor is configured to be supplied with a second control signal for returning the data from the second circuit to the first circuit, and
the first circuit is electrically connected to one of a source and a drain of the third transistor and the other of the source and the drain of the first transistor.

3. The semiconductor device according to claim 1, wherein a gate insulating film of the second transistor is thicker than a gate insulating film of the third transistor.

4. The semiconductor device according to claim 1, further comprising a capacitor comprising a pair of electrodes one of which is electrically connected to the gate of the second transistor.

5. An electronic component comprising:
the semiconductor device according to claim 1; and
a lead.

6. An electronic device comprising:
the electronic component according to claim 5; and
at least one of a display portion, a speaker, a microphone, and an operation button.

7. The semiconductor device according to claim 2, wherein a gate insulating film of the second transistor is thicker than a gate insulating film of the third transistor.

8. The semiconductor device according to claim 2, further comprising a capacitor comprising a pair of electrodes one of which is electrically connected to the gate of the second transistor.

9. An electronic component comprising:
the semiconductor device according to claim 2; and
a lead.

10. An electronic device comprising:
the electronic component according to claim 9; and
at least one of a display portion, a speaker, a microphone, and an operation key.

11. The semiconductor device according to claim 1, wherein the second circuit includes an inverter, and
wherein the inverter is electrically connected with the other of the source and the drain of the first transistor.

12. The semiconductor device according to claim 2, wherein the second circuit includes an inverter, and
wherein the inverter is electrically connected with the other of the source and the drain of the first transistor.

13. A semiconductor device comprising:
a first circuit including a flip-flop; and
a second circuit comprising a first transistor, a second transistor, a third transistor, a fourth transistor, a fifth transistor, and a sixth transistor,
wherein:
each of the first transistor, the second transistor, the fourth transistor, and the fifth transistor comprises a channel formation region including an oxide semiconductor,
the third transistor and the sixth transistor comprise a channel formation region including silicon,
a gate of the second transistor is electrically connected to one of a source and a drain of the first transistor,
a gate of the third transistor is electrically connected to one of a source and a drain of the second transistor, and
a gate of the fifth transistor is electrically connected to one of a source and a drain of the fourth transistor,
a gate of the sixth transistor is electrically connected to one of a source and a drain of the fifth transistor,
the first circuit is electrically connected to one of a source and a drain of the third transistor, one of a source and a drain of the sixth transistor, the other of the source and the drain of the first transistor, and the other of the source and the drain of the fourth transistor, and
the other of the source and the drain of the third transistor is electrically connected to the other of the source and the drain of the sixth transistor.

14. The semiconductor device according to claim 13, wherein a gate insulating film of the second transistor is thicker than a gate insulating film of the third transistor.

15. The semiconductor device according to claim 13, further comprising a capacitor comprising a pair of electrodes one of which is electrically connected to the gate of the second transistor.

16. An electronic component comprising:
the semiconductor device according to claim 13; and
a lead.

17. An electronic device comprising:
the electronic component according to claim 16; and
at least one of a display portion, a speaker, a microphone, and an operation button.

18. The semiconductor device according to claim 13, wherein the second circuit includes an inverter, and
wherein the inverter is electrically connected with the other of the source and the drain of the first transistor.

* * * * *